United States Patent
Sheng et al.

(10) Patent No.: US 8,203,071 B2
(45) Date of Patent: Jun. 19, 2012

(54) MULTI-JUNCTION SOLAR CELLS AND METHODS AND APPARATUSES FOR FORMING THE SAME

(75) Inventors: Shuran Sheng, Santa Clara, CA (US);
Yong Kee Chae, Pleasanton, CA (US);
Soo Young Choi, Fremont, CA (US);
Tae Kyung Won, San Jose, CA (US);
Liwei Li, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 86 days.

(21) Appl. No.: 12/178,289

(22) Filed: Jul. 23, 2008

(65) Prior Publication Data

US 2009/0020154 A1   Jan. 22, 2009

Related U.S. Application Data

(63) Continuation-in-part of application No. 12/110,120, filed on Apr. 25, 2008, which is a continuation-in-part of application No. 11/671,988, filed on Feb. 6, 2007, now Pat. No. 7,582,515, which is a continuation-in-part of application No. 11/624,677, filed on Jan. 18, 2007.

(60) Provisional application No. 60/951,608, filed on Jul. 24, 2007, provisional application No. 60/982,400, filed on Oct. 24, 2007.

(51) Int. Cl.
*H01L 31/00* (2006.01)
(52) U.S. Cl. ..................................... 136/255
(58) Field of Classification Search ............ 136/252, 136/255, 258, 261
See application file for complete search history.

(56) References Cited

U.S. PATENT DOCUMENTS

| | | | |
|---|---|---|---|
| 4,063,735 A | 12/1977 | Wendel | |
| 4,068,043 A | 1/1978 | Carr | |
| 4,117,506 A | 9/1978 | Carlson et al. | |
| 4,271,328 A | 6/1981 | Hamakawa et al. | |
| 4,272,641 A | 6/1981 | Hanak | |
| 4,377,723 A | 3/1983 | Dalal | |
| 4,400,577 A | 8/1983 | Spear | |
| 4,459,163 A * | 7/1984 | MacDiarmid et al. | 438/482 |

(Continued)

FOREIGN PATENT DOCUMENTS

CN   1220484 A   6/1999
(Continued)

OTHER PUBLICATIONS

Arya et al., Amorphous silicon p-i-n solar cells with graded interface, Appl. Phys. Letters, vol. 49, No. 17 (Oct. 27, 1986).*
International Search Report for PCT/US2008/069685 dated Oct. 3, 2008.
PCT Search Report and Written Opinion dated Oct. 14, 2008 for International Application No. PCT/US08/70900.

(Continued)

*Primary Examiner* — Jennifer Michener
*Assistant Examiner* — Shannon Gardner
(74) *Attorney, Agent, or Firm* — Patterson & Sheridan, LLP

(57) ABSTRACT

Embodiments of the present invention generally relate to solar cells and methods and apparatuses for forming the same. More particularly, embodiments of the present invention relate to thin film multi-junction solar cells and methods and apparatuses for forming the same. Embodiments of the present invention also include an improved thin film silicon solar cell, and methods and apparatus for forming the same, where one or more of the layers in the solar cell comprises at least one amorphous silicon layer that has improved electrical characteristics and mechanical properties, and is capable of being deposited at rates many times faster than conventional amorphous silicon deposition processes.

17 Claims, 9 Drawing Sheets

U.S. PATENT DOCUMENTS

| | | | |
|---|---|---|---|
| 4,471,155 A | 9/1984 | Mohr et al. |
| 4,476,346 A | 10/1984 | Tawada et al. |
| 4,490,573 A | 12/1984 | Gibbons |
| 4,571,448 A | 2/1986 | Barnett |
| 4,591,892 A | 5/1986 | Yamazaki |
| 4,633,034 A | 12/1986 | Nath et al. |
| 4,667,058 A | 5/1987 | Catalano et al. |
| 4,690,717 A | 9/1987 | Yamazaki |
| 4,728,370 A | 3/1988 | Ishii et al. |
| 4,737,196 A | 4/1988 | Yukimoto |
| 4,755,475 A | 7/1988 | Kiyama et al. |
| 4,776,894 A | 10/1988 | Watanabe et al. |
| 4,781,765 A | 11/1988 | Watanabe et al. |
| 4,841,908 A | 6/1989 | Jacobson et al. |
| 4,878,097 A | 10/1989 | Yamazaki et al. |
| 4,891,330 A | 1/1990 | Guha et al. |
| 4,907,052 A | 3/1990 | Takada et al. |
| 4,948,436 A | 8/1990 | Juergens |
| 4,954,856 A | 9/1990 | Yamazaki |
| 5,009,719 A | 4/1991 | Yoshida |
| 5,015,838 A | 5/1991 | Yamagishi et al. |
| 5,021,100 A | 6/1991 | Ishihara et al. |
| 5,032,884 A | 7/1991 | Yamagishi et al. |
| 5,055,141 A | 10/1991 | Arya et al. |
| 5,246,506 A | 9/1993 | Arya et al. |
| 5,252,142 A | 10/1993 | Matsuyama et al. |
| 5,256,887 A | 10/1993 | Yang |
| 5,278,015 A | 1/1994 | Iwamoto et al. |
| 5,324,365 A | 6/1994 | Niwa |
| 5,403,404 A | 4/1995 | Arya et al. |
| 5,419,783 A | 5/1995 | Noguchi et al. |
| 5,453,135 A | 9/1995 | Nakagawa et al. |
| 5,469,300 A | 11/1995 | Nomura |
| 5,589,007 A | 12/1996 | Fujioka et al. |
| 5,620,530 A | 4/1997 | Nakayama |
| 5,667,597 A | 9/1997 | Ishihara |
| 5,677,236 A | 10/1997 | Saitoh et al. |
| 5,700,467 A | 12/1997 | Shima et al. |
| 5,720,826 A | 2/1998 | Hayashi et al. |
| 5,730,808 A | 3/1998 | Yang et al. |
| 5,738,731 A | 4/1998 | Shindo et al. |
| 5,738,732 A | 4/1998 | Nakamura et al. |
| 5,739,043 A | 4/1998 | Yamamoto |
| 5,797,998 A | 8/1998 | Wenham et al. |
| 5,828,117 A | 10/1998 | Kondo et al. |
| 5,853,498 A | 12/1998 | Beneking et al. |
| 5,911,839 A | 6/1999 | Tsai et al. |
| 5,913,986 A | 6/1999 | Matsuyama |
| 5,927,994 A | 7/1999 | Kohda et al. |
| 5,942,049 A * | 8/1999 | Li et al. ............... 136/258 |
| 5,942,050 A | 8/1999 | Green et al. |
| 5,977,476 A | 11/1999 | Guha et al. |
| 6,077,722 A | 6/2000 | Jansen et al. |
| 6,078,059 A | 6/2000 | Nakata |
| 6,100,466 A | 8/2000 | Nishimoto |
| 6,111,189 A | 8/2000 | Garvison et al. |
| 6,121,541 A | 9/2000 | Arya |
| 6,168,968 B1 | 1/2001 | Umemoto et al. |
| 6,180,870 B1 | 1/2001 | Sano et al. |
| 6,190,932 B1 | 2/2001 | Yoshimi et al. |
| 6,200,825 B1 | 3/2001 | Yoshimi et al. |
| 6,211,454 B1 | 4/2001 | Sano |
| 6,222,115 B1 | 4/2001 | Nakanishi |
| 6,242,686 B1 | 6/2001 | Kishimoto et al. |
| 6,265,288 B1 | 7/2001 | Okamoto et al. |
| 6,274,804 B1 | 8/2001 | Psyk et al. |
| 6,281,426 B1 | 8/2001 | Olson et al. |
| 6,281,561 B1 | 8/2001 | Stiebig et al. |
| 6,288,325 B1 | 9/2001 | Jansen et al. |
| 6,297,443 B1 | 10/2001 | Nakajima et al. |
| 6,307,146 B1 | 10/2001 | Takeuchi et al. |
| 6,309,906 B1 | 10/2001 | Meier et al. |
| 6,326,304 B1 | 12/2001 | Yoshimi et al. |
| 6,337,224 B1 | 1/2002 | Okamoto et al. |
| 6,368,892 B1 | 4/2002 | Arya |
| 6,380,480 B1 | 4/2002 | Norimatsu et al. |
| 6,383,898 B1 * | 5/2002 | Kishimoto ............... 438/482 |
| 6,395,973 B2 | 5/2002 | Fujisawa et al. |
| 6,399,873 B1 | 6/2002 | Sano et al. |
| 6,444,277 B1 | 9/2002 | Law et al. |
| 6,459,034 B2 | 10/2002 | Muramoto et al. |
| 6,506,622 B1 | 1/2003 | Shiozaki |
| 6,521,826 B2 | 2/2003 | Wada |
| 6,566,159 B2 | 5/2003 | Sawada et al. |
| 6,587,263 B1 | 7/2003 | Iacovangelo et al. |
| 6,602,606 B1 | 8/2003 | Fujisawa et al. |
| 6,632,993 B2 | 10/2003 | Hayashi et al. |
| 6,634,572 B1 | 10/2003 | Burgener |
| 6,645,573 B2 | 11/2003 | Higashikawa et al. |
| 6,660,931 B2 | 12/2003 | Toyama et al. |
| 6,670,543 B2 | 12/2003 | Lohmeyer et al. |
| 6,750,394 B2 | 6/2004 | Yamamoto et al. |
| 6,759,645 B2 | 7/2004 | Tawada et al. |
| 6,777,610 B2 | 8/2004 | Yamada et al. |
| 6,784,361 B2 | 8/2004 | Carlson et al. |
| 6,793,733 B2 | 9/2004 | Janakiraman et al. |
| 6,815,788 B2 | 11/2004 | Oka et al. |
| 6,825,104 B2 | 11/2004 | Horzel et al. |
| 6,825,408 B2 | 11/2004 | Nagano et al. |
| 6,850,991 B1 | 2/2005 | Young et al. |
| 6,887,728 B2 | 5/2005 | Miller et al. |
| 6,960,718 B2 | 11/2005 | Sano et al. |
| 6,963,120 B2 | 11/2005 | Shiozaki et al. |
| 6,979,589 B2 | 12/2005 | Kishimoto et al. |
| 6,989,553 B2 | 1/2006 | Yokogawa et al. |
| 7,001,460 B2 | 2/2006 | Saito et al. |
| 7,030,313 B2 | 4/2006 | Inamasu et al. |
| 7,032,536 B2 | 4/2006 | Fukuoka et al. |
| 7,064,263 B2 | 6/2006 | Sano et al. |
| 7,071,018 B2 | 7/2006 | Mason et al. |
| 7,074,641 B2 | 7/2006 | Kondo et al. |
| 7,235,810 B1 | 6/2007 | Yamazaki et al. |
| 7,238,545 B2 | 7/2007 | Yoshimi et al. |
| 7,256,140 B2 | 8/2007 | Call et al. |
| 7,301,215 B2 | 11/2007 | Kariya |
| 7,309,832 B2 | 12/2007 | Friedman et al. |
| 7,332,226 B2 | 2/2008 | Fujisawa et al. |
| 7,351,993 B2 | 4/2008 | Atanackovic |
| 7,375,378 B2 | 5/2008 | Manivannan et al. |
| 7,402,747 B2 | 7/2008 | Sugawara et al. |
| 7,560,750 B2 | 7/2009 | Niira et al. |
| 7,565,880 B2 | 7/2009 | Shimizu et al. |
| 7,582,515 B2 * | 9/2009 | Choi et al. ............... 438/141 |
| 2001/0035206 A1 | 11/2001 | Inamasu et al. |
| 2001/0051388 A1 | 12/2001 | Shiozaki et al. |
| 2001/0055888 A1 | 12/2001 | Madan et al. |
| 2002/0033191 A1 | 3/2002 | Kondo et al. |
| 2002/0066478 A1 | 6/2002 | Hayashi et al. |
| 2003/0013280 A1 | 1/2003 | Yamanaka |
| 2003/0041894 A1 | 3/2003 | Sverdrup et al. |
| 2003/0044539 A1 | 3/2003 | Oswald |
| 2003/0104664 A1 | 6/2003 | Kondo et al. |
| 2004/0045505 A1 | 3/2004 | Higashikawa et al. |
| 2004/0082097 A1 | 4/2004 | Lohmeyer et al. |
| 2004/0113287 A1 | 6/2004 | Kishimoto et al. |
| 2004/0187914 A1 | 9/2004 | Matsuda et al. |
| 2004/0231590 A1 | 11/2004 | Ovshinsky |
| 2004/0235286 A1 | 11/2004 | Kroll et al. |
| 2005/0101160 A1 | 5/2005 | Garg et al. |
| 2005/0115504 A1 | 6/2005 | Ueda et al. |
| 2005/0173704 A1 | 8/2005 | Saito et al. |
| 2005/0181534 A1 | 8/2005 | Yoshimi et al. |
| 2005/0189012 A1 | 9/2005 | Kondo et al. |
| 2005/0251990 A1 | 11/2005 | Choi et al. |
| 2005/0284517 A1 | 12/2005 | Shinohara |
| 2006/0024442 A1 | 2/2006 | Ovshinsky |
| 2006/0038182 A1 | 2/2006 | Rogers et al. |
| 2006/0060138 A1 | 3/2006 | Keller et al. |
| 2006/0134496 A1 | 6/2006 | Won et al. |
| 2006/0169317 A1 | 8/2006 | Sato et al. |
| 2006/0240649 A1 | 10/2006 | Roschek et al. |
| 2006/0249196 A1 | 11/2006 | Shima |
| 2006/0283496 A1 | 12/2006 | Okamoto et al. |
| 2007/0000538 A1 | 1/2007 | Shima |
| 2007/0039942 A1 | 2/2007 | Leung et al. |
| 2007/0137698 A1 | 6/2007 | Wanlass et al. |
| 2007/0151596 A1 | 7/2007 | Nasuno et al. |

| | | | |
|---|---|---|---|
| 2007/0209699 | A1 | 9/2007 | Sichanugrist et al. |
| 2007/0227579 | A1 | 10/2007 | Buller et al. |
| 2007/0249898 | A1 | 10/2007 | Otawara |
| 2007/0298590 | A1 | 12/2007 | Choi et al. |
| 2008/0047599 | A1 | 2/2008 | Buller et al. |
| 2008/0047603 | A1 | 2/2008 | Krasnov |
| 2008/0057220 | A1 | 3/2008 | Bachrach et al. |
| 2008/0110491 | A1 | 5/2008 | Buller et al. |
| 2008/0153280 | A1 | 6/2008 | Li et al. |
| 2008/0156370 | A1 | 7/2008 | Abdallah et al. |
| 2008/0160661 | A1 | 7/2008 | Henley |
| 2008/0173350 | A1 | 7/2008 | Choi et al. |
| 2008/0185036 | A1 | 8/2008 | Sasaki et al. |
| 2008/0188033 | A1 | 8/2008 | Choi et al. |
| 2008/0196761 | A1 | 8/2008 | Nakano et al. |
| 2008/0223440 | A1* | 9/2008 | Sheng et al. .................. 136/258 |
| 2008/0264480 | A1* | 10/2008 | Choi et al. .................. 136/255 |
| 2009/0104733 | A1 | 4/2009 | Chae et al. |

FOREIGN PATENT DOCUMENTS

| | | |
|---|---|---|
| EP | 0 994 515 A2 | 4/2000 |
| EP | 1420081 | 5/2004 |
| EP | 1 650 811 | 4/2006 |
| JP | 10294482 A | 11/1998 |
| JP | 2000-252493 A | 9/2000 |
| JP | 2000252496 | 9/2000 |
| JP | 2005/135986 | 5/2005 |
| JP | 2006-269607 A | 10/2006 |
| KR | 20060067919 | 6/2006 |
| WO | WO-9526571 A1 | 10/1995 |
| WO | WO 03/065462 | 8/2003 |
| WO | WO-03096080 A2 | 11/2003 |
| WO | WO 2007/118252 | 10/2007 |

OTHER PUBLICATIONS

PCT International Search Report and Written Opinion dated Dec. 23, 2008 for International Application No. PCT/US2008/080641.
A. Vijh, et al.; Film Adhesion in Triple Junction a-Si Solar Cells on Polymide Substrates; 0-7803-8707—Apr. 2005, IEEE (2005).
Freiesleben, et al. "Photovoltaic Solar Energy Conference," Proceedings of the International Conference, Oct. 23-27, 1995.
Lukas Andreas Feiknecht. "Microcrystalline Silicon Solar Cells in the N-I-P Configuration: Optimisations on Light Scattering Back-Reflectors," Sep. 25, 2003.
Zhu, et al. "A Wide Band Gap Boron-doped Microcrystalline Silicon Film Obtained with VHP Glow Discharge Method," 2005.
Meier, et al, "Thin-Film Silicon Cell Technology: Current and Near Future," Oerlikon Solar. Sep. 2008.
Vallat-Sauvain, et al. "Evolution of the Microstructure in Microcrystalline Silicon Prepared by Very High Frequency Glow-Discharge Using Hydrogen Dilution," Journal of Applied Physics. vol. 87 No. 6. Mar. 2000.
Prosecution history of U.S. Appl. No. 12/263,253 as of Mar. 4, 2010.
Prosecution history of U.S. Appl. No. 12/263,032 as of Mar. 4, 2010.
Prosecution history of U.S. Appl. No. 11/671,988 as of Mar. 4, 2010.
Prosecution history of U.S. Appl. No. 12/178,289 as of Mar. 4, 2010.
S. Morrison, et al, "Deposition of Amorphus Silicon Solar Cells Via the Pulsed PECVD Technique", IEEE, p. 928-931, 2000 IEEE.
Andre Anders, "Fundamentals of Pulsed Plasmas for Materials Processing", Invited Talk Presented at The International Conference on Metallurgical Coatings and Thin Films, San Diego, Apr. 28-May 2, 2003.
Tobias Roschek, et al., "High Rate Depositin of Microcrystalline Silicon Solar Cells Using 13.56 MHz PECVD-Prerequisities and Limiting Factors", Mat. Res. Soc. Symp. Proc. vol. 715 at 2002 Materials Research Society, A26.5.1-26.5.6.
Office Action. U.S. Appl. No. 11/426,127 dated Jan. 6, 2009.
PCT International Search Report and Written Opinion dated Dec. 22, 2008 for International Application No. PCT/US2008/80834.
Veprek, et al. "Properties of microcrystalline silicon. IV. Electrical conductivity, electron spin resonance and the effect of gas adsorption". Issue 32, Nov. 20, 1983.
International Search Report and Written Opinion of PCT/US07/71703, dated Dec. 6, 2007.
Shah, et al. "Microcrystalline Silicon and 'micromorph' tandem Solar Cells," Thin Solid Films 403-404 (2002), p. 179-187.
G. Willeke. "Physics and Electronic Properties of Microcrystalline Semiconductors." 1992 Artech House, Inc.
Schropp, et al. "Amorphous and Microcrystalline Solar Cells: Modeling, Materials and Device Technology," Kluwer Academic Publishers, 1998.
"Hydrogenated amorphous silicon," Cambridge University Press 1991, pp. 344.
U.S. Appl. No. 11/624,677, filed Jan. 18, 2007 entitled, "Multi-Junction Solar Cells and Methods and Apparatuses for Forming the Same."
U.S. Appl. No. 11/671,988, filed Feb. 6, 2007 entitled, "Multi-Junction Solar Cells and Methods and Apparatuses for Forming the Same."
International Search Report dated Jan. 23, 2009, International Application No. PCT/US08/82135.
Office Action for U.S. Appl. No. 11/624,677, dated Sep. 16, 2009.
PCT Search Report and Written Opinion for PCT/US08/59274, Aug. 26, 2008, consists of 9 unnumbered pages.
D.Das, et al. "Characterization of Undoped μc-SiO:H films prepared from (SiH4 + C02 + H2)—plasma in RF glow discharge, Solar Energy Materials & Solar Cells 63" (2000), pp. 285-297.
A. Lambertz, et al. "Microcrystalline silicone oxide as intermediate reflector for thin film silicon solar cells", 22nd European Photovoltaic Solar Energy Conference, Sep. 3-7, 2007, Milan, Italy, pp. 1839-1842.
Buehlmann, et al. "In situ silicon oxide based intermediate reflector for thin-film silicon micromorph solar cells", Applied Physics Letters 91, 143505 (2007).
K. Yamamoto, et al. "A Thin-Film Silicon Solar Cell and Module, Progress in Photovoltaics: Research and Applications". 2005, 13, pp. 489-494.
Office Action. U.S. Appl. No. 11/876,173, dated Feb. 20, 2009.
Korean Office Action dated May 25, 2009, Korean Patent Application No. 10-2007-0107740 (with English translation).
B. Rech et al article, "Amorphous and Microcrystalline Silicon Solar Cells Prepared at High Deposition Rates Using RF (13.56 MHz) Plasma Excitation Frequencies." Solar Energy Materials & Solar Cells 66 (2001), pp. 267-273.
Platz et al article, "H2-Dilution Vs. Buffer Layers for Increased Voc." Institut de Microtechnique, Universite de Neuchatel, Rue A.-L. Breguet 2, CH-2000 Neuchatel, Switzerland.
PCT International Search Report and Written Opinion dated Jun. 27, 2008 for International Application No. PCT/US2008/50770.
O. Vetterl, et al "Preparation Temperature Effects in Microcrystalline Silicon Thin Film Solar Cells", Mat. Res. Soc. Symp. Proc. vol. 664 p. A 25.8.1-A 25.8.6, 2001.
Stefan Klein, et al. "Microcrystalline Silicon Prepared by Hot-Wire Chemical Vapor Deposition for Thin Film Solar Cell Applications", Jpn J. Appl. Phys. vol. 41(2002)pp. L 10-12, Jan. 2002.
S. Klein, et al "High Efficiency Thin Film Solar Cells with Intrinsic Microcrystalline Silicon Prepared by Hot Wire CVD" Mat. Res. Soc. Symp. Proc. vol. 715 @ 2002 Materials Research Society, pp. A26.2.1-A 26.2.6.
Ujjwal K. Das et al "Amorphous and Microcrystalline silicon Solar Cells Grown by Pulsed PECVD Technique", Mat. Res. Soc. Symp. Proc. vol. 715 @ 2002 Materials Research Society pp. A. 26.6.1-A 26.6.6.
Office Action dated Sep. 30, 2009 for Korean Patent Application No. 2007-0107740.
PCT Search Report and Written Opinion for PCT/US08/70900, Oct. 14, 2008, consists of 13 pages.
Chinese Office Action dated May 20, 2010 for Chinese Patent Application No. 200880000178.9.
Chinese Application No. 200880000178.9 Office Action dated Feb. 17, 2011.
Shah article, "Thin-Film Silicon Solar Cell Technology." Prog. Photovolt: Res. Appl. 2004; 12:113-142.
Official Letter dated Jun. 22, 2010, from Korean Patent Office for corresponding Korean Patent application No. 10-2008-7026072. Notice to File a Response provides a concise statement of relevance.

* cited by examiner

| LAYER | Gas (sccm) | | | | | RF (W) | Pres. (Torr) | Time (Sec) | Thick (Å) | D/R (Å/min) |
|---|---|---|---|---|---|---|---|---|---|---|
| | SiH4 | H2 | PH3 (0.5%) | TMB (0.5%) | CH4 | | | | | |
| (1) p-aSi:C | 590 | 3000 | | 400 | 800 | 270 | 2.5 | 17 | 100 | 348 |
| (2) i-aSi | 600 | 5000 | | | | 230 | 2.0 | 698 | 2600 | 224 |
| (3) n-aSi | 900 | 4400 | 150 | | | 470 | 1.5 | 5 | 50 | 657 |
| (4) n+mcSi | 60 | 18000 | 60 | | | 1500 | 9.0 | 92 | 200 | 130 |
| (5) p+mcSi | 75 | 48750 | | 30 | | 1500 | 9.0 | 92 | 200 | 130 |
| (6) i-mcSi | 165 | 14025 | | | | 1500 | 6.0 | 847 | 5000 | 354 |
| (7) i-mcSi | 165 | 13324 | | | | 1500 | 6.0 | 833 | 5000 | 360 |
| (8) i-mcSi | 165 | 12623 | | | | 1500 | 6.0 | 820 | 5000 | 366 |
| (9) i-mcSi | 165 | 11921 | | | | 1500 | 6.0 | 806 | 5000 | 372 |
| (10) n-aSi | 900 | 4400 | 150 | | | 470 | 1.5 | 18 | 200 | 657 |
| (11) n-aSi | 60 | | 500 | | | 470 | 1.5 | 17 | 80 | 282 |

FIG. 6

| Initial Cell Efficiency (%) | 11.00 |
|---|---|
| Jsc (mA/cm$^2$) | 11.0 |
| Voc (V) | 1.363 |
| FF (%) | 73.5 |

FIG. 7

MULTI-JUNCTION SOLAR CELLS AND METHODS AND APPARATUSES FOR FORMING THE SAME

CROSS-REFERENCE TO RELATED APPLICATIONS

This application is a continuation-in-part of U.S. patent application Ser. No. 12/110,120 filed Apr. 25, 2008, which is a continuation-in-part application of U.S. patent application Ser. No. 11/671,988 filed Feb. 6, 2007 now U.S. Pat. No. 7,582,515, which is a continuation-in-part application of U.S. patent application Ser. No. 11/624,677, filed Jan. 18, 2007, which are incorporated by reference in their entireties.

This application also claims benefit of U.S. Provisional Patent Application Ser. No. 60/951,608, filed Jul. 24, 2007 and the U.S. Provisional Patent Application Ser. No. 60/982,400, filed Oct. 24, 2007, both of which are incorporated by reference in their entireties.

BACKGROUND OF THE INVENTION

1. Field of the Invention

Embodiments of the present invention generally relate to solar cells and methods and apparatuses for forming the same. More particularly, embodiments of the present invention relate to thin film multi-junction solar cells and methods and apparatuses for forming the same.

2. Description of the Related Art

Solar cells convert solar radiation and other light into usable electrical energy. The energy conversion occurs as the result of the photovoltaic effect. Solar cells may be formed from crystalline material or from amorphous or micro-crystalline materials. Generally, there are two major types of solar cells that are produced in large quantities today, which are crystalline silicon solar cells and thin film solar cells. Crystalline silicon solar cells typically use either mono-crystalline substrates (i.e., single-crystal substrates of pure silicon) or a multi-crystalline silicon substrates (i.e., poly-crystalline or polysilicon). Additional film layers are deposited onto the silicon substrates to improve light capture, form the electrical circuits, and protect the devices. Thin-film solar cells use thin layers of materials deposited on suitable substrates to form one or more p-n junctions. Suitable substrates include glass, metal, and polymer substrates. It has been found that the properties of thin-film solar cells degrade over time upon exposure to light, which can cause the device stability to be less than desired. Typical solar cell properties that may degrade are the fill factor (FF), short circuit current, and open circuit voltage (Voc).

Problems with current thin film solar cells include low efficiency and high cost. Therefore, there is a need for improved thin film solar cells and methods and apparatuses for forming the same in a factory environment. There is also a need for a process which will fabricate high stability p-i-n solar cells having high fill factor, high short circuit current, high open circuit voltage and good device stability.

SUMMARY OF THE INVENTION

Embodiments of the present invention relate to thin film multi-junction solar cells and methods and apparatuses for forming the same. In one embodiment, a method of forming a thin film multi-junction solar cell over a substrate comprises forming a first p-i-n junction and forming a second p-i-n junction over the first p-i-n junction. Forming a first p-i-n junction may comprise forming a p-type amorphous silicon layer, forming an intrinsic type amorphous silicon layer over the p-type amorphous silicon layer, and forming an n-type microcrystalline silicon layer over the intrinsic type amorphous silicon layer. Forming a second p-i-n junction may comprise forming a p-type microcrystalline silicon layer, forming an intrinsic type microcrystalline silicon layer over the p-type microcrystalline silicon layer, and forming an n-type amorphous silicon layer over the intrinsic type microcrystalline layer. In one embodiment, an apparatus for forming a thin film multi-junction solar cell comprises at least one first system configured to form a first p-i-n junction and at least one second system configured to form a second p-i-n junction over the first p-i-n junction. The first system may comprise a single p-chamber configured to deposit a p-type amorphous silicon layer and a plurality of i/n-chambers each configured to deposit an intrinsic type amorphous silicon layer and an n-type microcrystalline silicon layer. The second system may comprise a single p-chamber configured to deposit a p-type microcrystalline silicon layer and a plurality of i/n-chambers each configured to deposit an intrinsic type microcrystalline silicon layer and an n-type amorphous silicon layer.

Embodiments of the present invention may further provide a method of forming a thin film multi-junction solar cell over a substrate, comprising forming a first photovoltaic junction on a substrate, and forming a second photovoltaic junction over the first photovoltaic junction, comprising forming a p-type microcrystalline silicon layer, forming an intrinsic type microcrystalline silicon layer over the p-type microcrystalline silicon layer, wherein one or more process variables are adjusted to control the crystalline fraction at two or more points within the thickness of intrinsic type microcrystalline silicon layer as the intrinsic type microcrystalline silicon layer is formed, and forming an n-type amorphous silicon layer over the intrinsic type microcrystalline layer.

Embodiments of the present invention may further provide a method of forming a thin film multi-junction solar cell over a substrate, comprising forming a first photovoltaic junction on a substrate, comprising forming a p-type amorphous silicon layer, forming an intrinsic type amorphous silicon layer over the p-type amorphous silicon layer, wherein the intrinsic type amorphous silicon layer includes a p-i buffer intrinsic type amorphous silicon layer and a bulk intrinsic type amorphous silicon layer, and forming a n-type microcrystalline silicon layer over the intrinsic type amorphous silicon layer; and forming a second photovoltaic junction over the first photovoltaic junction, comprising forming a p-type microcrystalline silicon layer, forming an intrinsic type microcrystalline silicon layer over the p-type microcrystalline silicon layer, and forming an n-type amorphous silicon layer over the intrinsic type microcrystalline layer.

Embodiments of the present invention may further provide a tandem junction photovoltaic device, comprising a first photovoltaic junction and a second photovoltaic junction, wherein the second photovoltaic junction comprises a p-doped microcrystalline silicon layer, an intrinsic type microcrystalline silicon layer, wherein the intrinsic type microcrystalline silicon layer is formed by a multiple step deposition process, wherein each deposition step has a gas mixture having different hydrogen to silane ratio to form different film crystalline fraction in each deposition step, and an n-doped amorphous silicon layer adjacent to the intrinsic type microcrystalline silicon layer. In one embodiment, the different hydrogen to silane ratio controls the crystalline fraction being formed uniformly across the overall thickness of the intrinsic type microcrystalline silicon layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

FIG. 6 depicts deposition parameters set to form a tandem p-i-n junction solar cell.

FIG. 7 depicts properties of a solar cell of one embodiment of the present invention.

Figure 1:
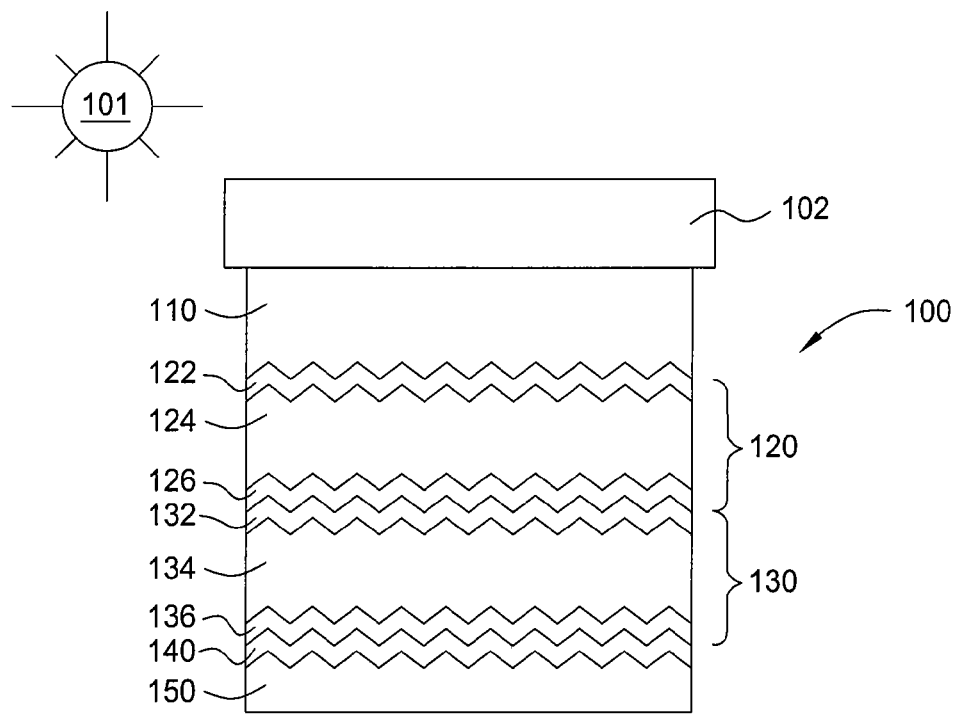
FIG. 1 is a schematic diagram of certain embodiments of a multi-junction solar cell oriented toward the light or solar radiation.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

Embodiments of the present invention include improved thin film multi-junction solar cells and methods and apparatus for forming the same. FIG. 1 is a schematic diagram of certain embodiments of a multi-junction solar cell 100 oriented toward the light or solar radiation 101. Solar cell 100 comprises a substrate 102, such as a glass substrate, polymer substrate, metal substrate, or other suitable substrate, with thin films formed thereover. The solar cell 100 further comprises a first transparent conducting oxide (TCO) layer 110 formed over the substrate 102, a first p-i-n junction 120 formed over the first TCO layer 110, a second p-i-n junction 130 formed over the first p-i-n junction 120, a second TCO layer 140 formed over the second p-i-n junction 130, and a metal back layer 150 formed over the second TCO layer 140. To improve light absorption by enhancing light trapping, the substrate and/or one or more of thin films formed thereover may be optionally textured by wet, plasma, ion, and/or mechanical processes. For example, in the embodiment shown in FIG. 1, the first TCO layer 110 is textured and the subsequent thin films deposited thereover will generally follow the topography of the surface below it.

The first TCO layer 110 and the second TCO layer 140 may each comprise tin oxide, zinc oxide, indium tin oxide, cadmium stannate, combinations thereof, or other suitable materials. It is understood that the TCO materials may also include additional dopants and components. For example, zinc oxide may further include dopants, such as aluminum, gallium, boron, and other suitable dopants. Zinc oxide preferably comprises 5 atomic % or less of dopants, and more preferably comprises 2.5 atomic % or less aluminum. In certain instances, the substrate 102 may be provided by the glass manufacturers with the first TCO layer 110 already provided.

The first p-i-n junction 120 may comprise a p-type amorphous silicon layer 122, an intrinsic type amorphous silicon layer 124 formed over the p-type amorphous silicon layer 122, and an n-type microcrystalline silicon layer 126 formed over the intrinsic type amorphous silicon layer 124. In certain embodiments, the p-type amorphous silicon layer 122 may be formed to a thickness between about 60 Å and about 300 Å. In certain embodiments, the intrinsic type amorphous silicon layer 124 may be formed to a thickness between about 1,500 Å and about 3,500 Å. In certain embodiments, the n-type microcrystalline semiconductor layer 126 may be formed to a thickness between about 100 Å and about 400 Å.

The second p-i-n junction 130 may comprise a p-type microcrystalline silicon layer 132, an intrinsic type microcrystalline silicon layer 134 formed over the p-type microcrystalline silicon layer 132, and an n-type amorphous silicon layer 136 formed over the intrinsic type microcrystalline silicon layer 134. In certain embodiments, the p-type microcrystalline silicon layer 132 may be formed to a thickness between about 100 Å and about 400 Å. In certain embodiments, the intrinsic type microcrystalline silicon layer 134 may be formed to a thickness between about 10,000 Å and about 30,000 Å. In certain embodiments, the n-type amorphous silicon layer 136 may be formed to a thickness between about 100 Å and about 500 Å.

The metal back layer 150 may include, but not limited to a material selected from the group consisting of Al, Ag, Ti, Cr, Au, Cu, Pt, alloys thereof, or combinations thereof. Other processes may be performed to form the solar cell 100, such a laser scribing processes. Other films, materials, substrates, and/or packaging may be provided over metal back layer 150 to complete the solar cell. The solar cells may be interconnected to form modules, which in turn can be connected to form arrays.

Solar radiation 101 is absorbed by the intrinsic layers of the p-i-n junctions 120, 130 and is converted to electron-holes pairs. The electric field created between the p-type layer and the n-type layer that stretches across the intrinsic layer causes electrons to flow toward the n-type layers and holes to flow toward the p-type layers creating current. The first p-i-n junction 120 comprises an intrinsic type amorphous silicon layer 124 and the second p-i-n junction 130 comprises an intrinsic type microcrystalline silicon layer 134 because amorphous silicon and microcrystalline silicon absorb different wavelengths of solar radiation 101. Therefore, the solar cell 100 is more efficient since it captures a larger portion of the solar radiation spectrum. The intrinsic layer of amorphous silicon and the intrinsic layer of microcrystalline are stacked in such a way that solar radiation 101 first strikes the intrinsic type amorphous silicon layer 124 and then strikes the intrinsic type microcrystalline silicon layer 134 since amorphous silicon has a larger bandgap than microcrystalline silicon. Solar radiation not absorbed by the first p-i-n junction 120 continues on to the second p-i-n junction 130. It was surprising to find that the thicknesses disclosed herein of the p-i-n layers of the first p-i-n junction 120 and the second p-i-n junction 130 provided for a solar cell with improved efficiency and with a reduced cost of producing the same. Not wishing to be bound by theory unless explicitly recited in the claims, it is believed that on one hand a thicker intrinsic layer 124, 134 is beneficial to absorb a greater amount of the solar radiation spectrum and that on the other hand if the intrinsic layer 124, 134 and/or the p-i-n junctions 120, 130 are too thick the flow of electrons therethrough would be hampered.

In one aspect, the solar cell 100 does not need to utilize a metal tunnel layer between the first p-i-n junction 120 and the second p-i-n junction 130. The n-type microcrystalline silicon layer 126 of the first p-i-n junction 120 and the p-type microcrystalline silicon layer 132 has sufficient conductivity to provide a tunnel junction to allow electrons to flow from the first p-i-n junction 120 to the second p-i-n junction 130.

In one aspect, it is believed that the n-type amorphous silicon layer 136 of the second p-i-n junction 130 provides increased cell efficiency since it is more resistant to attack from oxygen, such as the oxygen in air. Oxygen may attack the silicon films and thus forming impurities which lower the capability of the films to participate in electron/hole transport therethrough. It is also believed that the lower electrical resistivity of an amorphous silicon layer versus a crystalline silicon layer the formed solar cell structure/device will have improved electrical properties due to the reduced affect of unwanted shunt paths on the power generation in the formed second p-i-n junction 130. Shunt paths, which generally extend vertically through the formed p-i-n layers, degrade the solar cells performance by shorting out local lateral regions of the formed solar cell device. Therefore, since the lateral resistance of the amorphous n-type layer (i.e., perpendicular to the vertical direction) is much higher than a crystalline layer the lower the affect that a shunt type defect will have on the rest of the formed solar cell. The reduction in the affect of shunt type defects will improve the solar cell's device performance.

Figure 2:
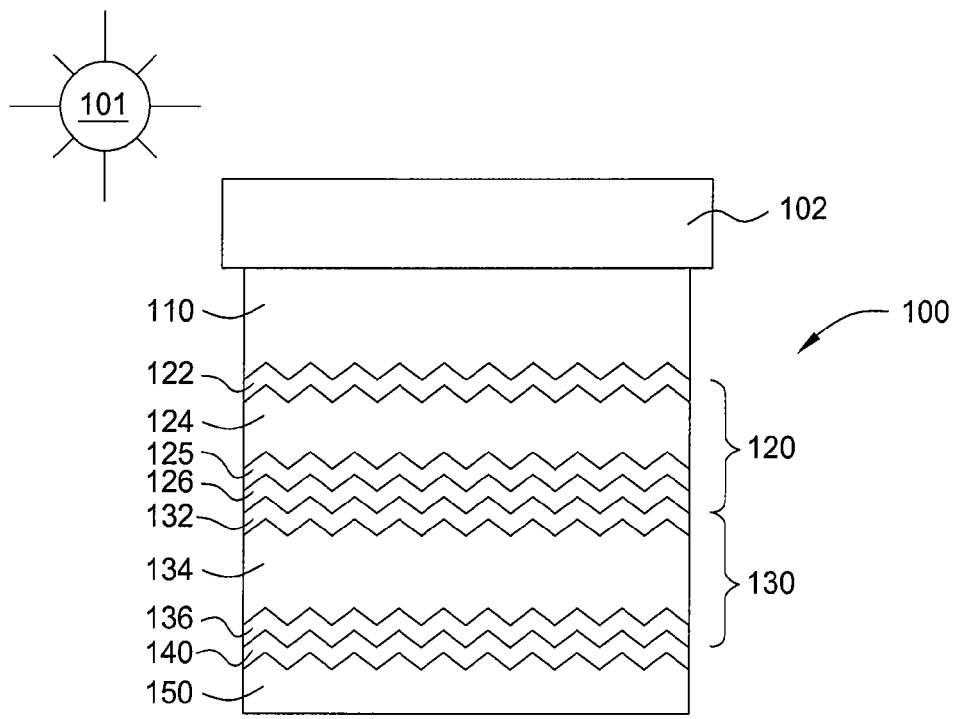
FIG. 2 is a schematic diagram of the multi-junction solar cell of FIG. 1 further comprising an n-type amorphous silicon buffer layer.

FIG. 2 is a schematic diagram of the multi-junction solar cell 100 of FIG. 1 further comprising an n-type amorphous silicon buffer layer 125 formed between the intrinsic type amorphous silicon layer 124 and the n-type microcrystalline silicon layer 126. In certain embodiments, the n-type amorphous silicon buffer layer 125 may be formed to a thickness between about 10 Å and about 200 Å. It is believed that the n-type amorphous silicon buffer layer 125 helps bridge the bandgap offset that is believed to exist between the intrinsic type amorphous silicon layer 124 and the n-type microcrystalline silicon layer 126. Thus it is believed that cell efficiency is improved due to enhanced current collection.

Figure 3:
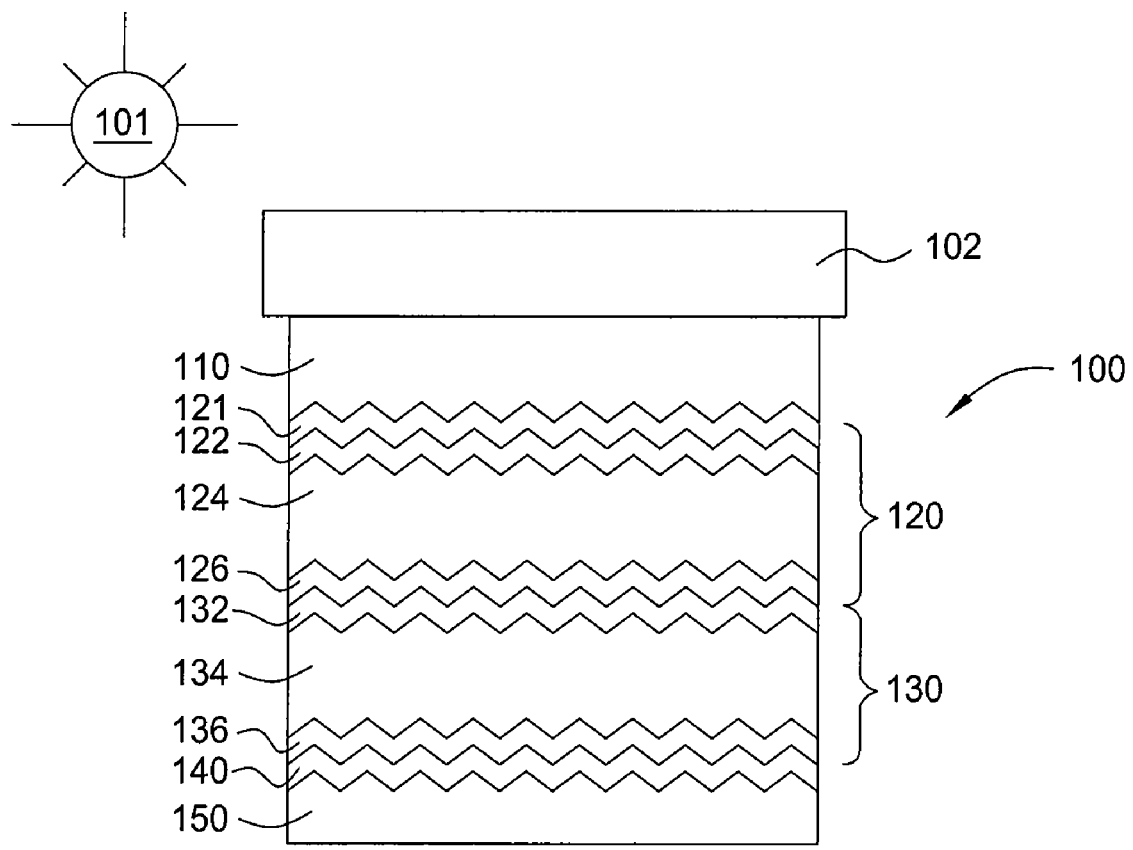
FIG. 3 is a schematic diagram of the multi-junction solar cell of FIG. 1 further comprising a p-type microcrystalline silicon contact layer.

FIG. 3 is a schematic diagram of the multi-junction solar cell 100 of FIG. 1 further comprising a p-type microcrystalline silicon contact layer 121 formed between the first TCO layer 110 and the p-type amorphous silicon layer 122. In certain embodiments, the p-type microcrystalline silicon contact layer 121 may be formed to a thickness between about 20 Å and about 200 Å. It is believed that the p-type microcrystalline silicon contact layer 121 helps achieve low resistance contact with the TCO layer. Thus, it is believed that cell efficiency is improved since current flow between the intrinsic type amorphous silicon layer 122 and the zinc oxide first TCO layer 110 is improved. It is preferred that the p-type microcrystalline silicon contact layer 121 be used with a TCO layer comprising a material that is resistant to a hydrogen plasma, such as zinc oxide, since a large amount of hydrogen is used to form the contact layer. It has been found that tin oxide is not suitable to be used in conjunction with the p-type microcrystalline silicon contact layer since it is chemically reduced by the hydrogen plasma. It is further understood that the solar cell 100 may further comprise an optional n-type amorphous silicon buffer layer formed between the intrinsic type amorphous silicon layer 124 and the n-type microcrystalline semiconductor layer 126 as described in FIG. 2.

Figure 4:
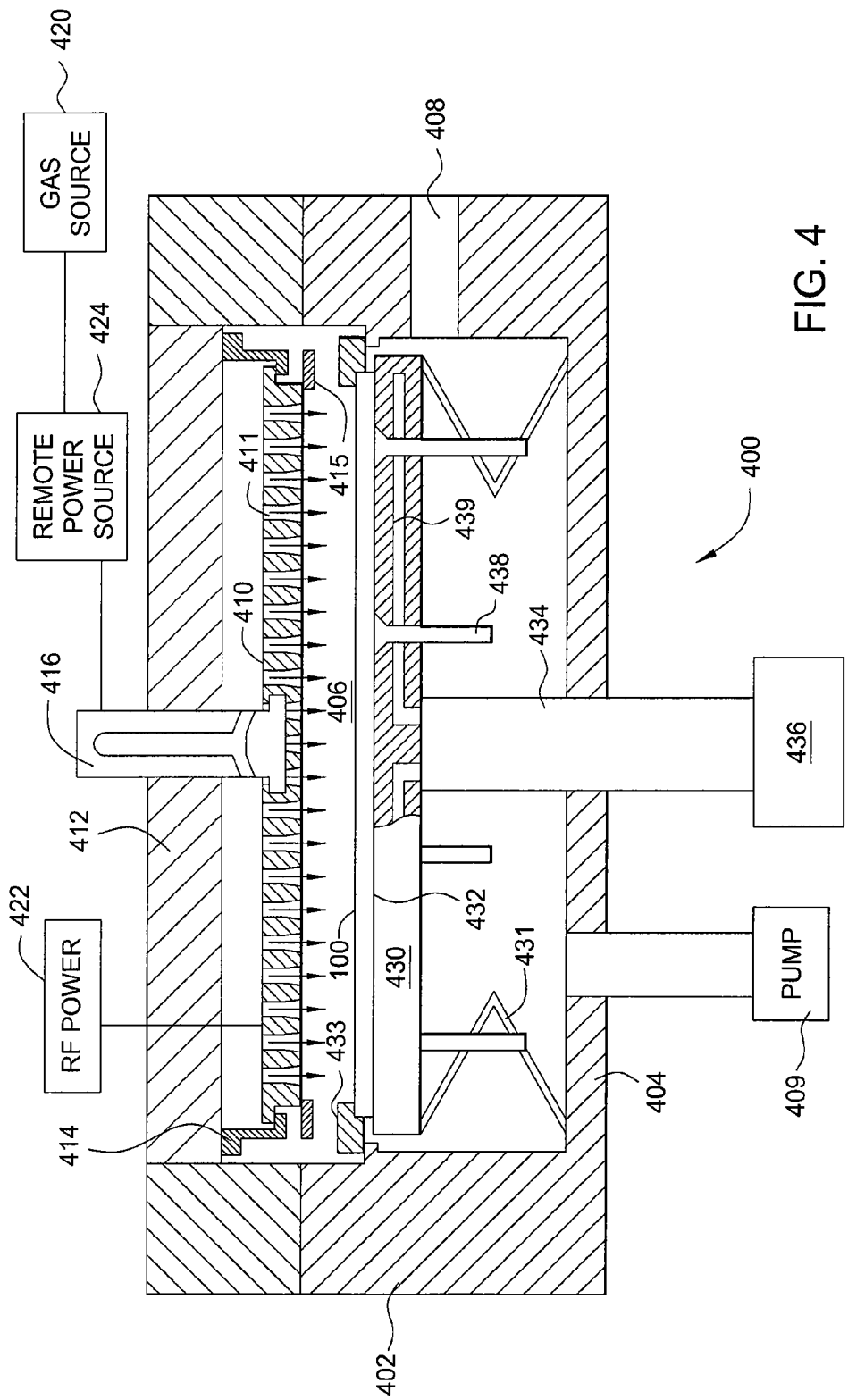
FIG. 4 is a schematic cross-section view of one embodiment of a plasma enhanced chemical vapor deposition (PECVD) chamber in which one or more films of a solar cell may be deposited.

FIG. 4 is a schematic cross-section view of one embodiment of a plasma enhanced chemical vapor deposition (PECVD) chamber 400 in which one or more films of a solar cell, such as the solar cell 100 of FIG. 1, FIG. 2, or FIG. 3, may be deposited. One suitable plasma enhanced chemical vapor deposition chamber is available from Applied Materials, Inc., located in Santa Clara, Calif. It is contemplated that other deposition chambers, including those from other manufacturers, may be utilized to practice the present invention.

The chamber 400 generally includes walls 402, a bottom 404, and a showerhead 410, and substrate support 430 which define a process volume 406. The process volume is accessed through a valve 408 such that the substrate, such as substrate 100, may be transferred in and out of the chamber 400. The substrate support 430 includes a substrate receiving surface 432 for supporting a substrate and stem 434 coupled to a lift system 436 to raise and lower the substrate support 430. A shadow from 433 may be optionally placed over periphery of the substrate 100. Lift pins 438 are moveably disposed through the substrate support 430 to move a substrate to and from the substrate receiving surface 432. The substrate support 430 may also include heating and/or cooling elements 439 to maintain the substrate support 430 at a desired temperature. The substrate support 430 may also include grounding straps 431 to provide RF grounding at the periphery of the substrate support 430. Examples of grounding straps are disclosed in U.S. Pat. No. 6,024,044 issued on Feb. 15, 2000 to Law et al. and U.S. patent application Ser. No. 11/613,934 filed on Dec. 20, 2006 to Park et al., which are both incorporated by reference in their entirety to the extent not inconsistent with the present disclosure.

The showerhead 410 is coupled to a backing plate 412 at its periphery by a suspension 414. The showerhead 410 may also be coupled to the backing plate by one or more center supports 416 to help prevent sag and/or control the straightness/curvature of the showerhead 410. A gas source 420 is coupled to the backing plate 412 to provide gas through the backing plate 412 and through the showerhead 410 to the substrate receiving surface 432. A vacuum pump 409 is coupled to the chamber 400 to control the process volume 406 at a desired pressure. An RF power source 422 is coupled to the backing plate 412 and/or to the showerhead 410 to provide a RF power to the showerhead 410 so that an electric field is created between the showerhead and the substrate support so that a plasma may be generated from the gases between the showerhead 410 and the substrate support 430. Various RF frequencies may be used, such as a frequency between about 0.3 MHz and about 200 MHz. In one embodiment the RF power source is provided at a frequency of 13.56 MHz. Examples of showerheads are disclosed in U.S. Pat. No. 6,477,980 issued on Nov. 12, 2002 to White et al., U.S. Publication 20050251990 published on Nov. 17, 2006 to Choi et al., and U.S. Publication 2006/0060138 published on Mar. 23, 2006 to Keller et al, which are all incorporated by reference in their entirety to the extent not inconsistent with the present disclosure.

A remote plasma source 424, such as an inductively coupled remote plasma source, may also be coupled between the gas source and the backing plate. Between processing substrates, a cleaning gas may be provided to the remote plasma source 424 so that a remote plasma is generated and provided to clean chamber components. The cleaning gas may be further excited by the RF power source 422 provided to the showerhead. Suitable cleaning gases include but are not limited to $NF_3$, $F_2$, and $SF_6$. Examples of remote plasma sources are disclosed in U.S. Pat. No. 5,788,778 issued Aug. 4, 1998 to Shang et al, which is incorporated by reference to the extent not inconsistent with the present disclosure.

The deposition methods for one or more silicon layers, such as one or more of the silicon layers of solar cell 100 of FIG. 1, FIG. 2, or FIG. 3, may include the following deposition parameters in the process chamber of FIG. 4 or other suitable chamber. A substrate having a surface area of 10,000 cm$^2$ or more, preferably 40,000 cm$^2$ or more, and more preferably 55,000 cm$^2$ or more is provided to the chamber. It is understood that after processing the substrate may be cut to form smaller solar cells.

In one embodiment, the heating and/or cooling elements 439 may be set to provide a substrate support temperature during deposition of about 400 degrees Celsius or less, preferably between about 100 degrees Celsius and about 400 degrees Celsius, more preferably between about 150 degrees Celsius and about 300 degrees Celsius, such as about 200 degrees Celsius.

The spacing during deposition between the top surface of a substrate disposed on the substrate receiving surface 432 and the showerhead 410 may be between 400 mil and about 1,200 mil, preferably between 400 mil and about 800 mil.

For deposition of silicon films, a silicon-based gas and a hydrogen-based gas are provided. Suitable silicon based gases include, but are not limited to silane ($SiH_4$), disilane ($Si_2H_6$), silicon tetrafluoride ($SiF_4$), silicon tetrachloride ($SiCl_4$), dichlorosilane ($SiH_2Cl_2$), and combinations thereof. Suitable hydrogen-based gases include, but are not limited to hydrogen gas ($H_2$). The p-type dopants of the p-type silicon layers may each comprise a group III element, such as boron or aluminum. Preferably, boron is used as the p-type dopant. Examples of boron-containing sources include trimethylboron (TMB (or $B(CH_3)_3$)), diborane ($B_2H_6$), $BF_3$, $B(C_2H_5)_3$, and similar compounds. Preferably, TMB is used as the p-type dopant. The n-type dopants of the n-type silicon layer may each comprise a group V element, such as phosphorus, arsenic, or antimony. Preferably, phosphorus is used as the n-type dopant. Examples of phosphorus-containing sources include phosphine and similar compounds. The dopants are typically provided with a carrier gas, such as hydrogen, argon, helium, and other suitable compounds. In the process regimes disclosed herein, a total flow rate of hydrogen gas is provided. Therefore, if a hydrogen gas is provided as the carrier gas, such as for the dopant, the carrier gas flow rate should be subtracted from the total flow rate of hydrogen to determine how much additional hydrogen gas should be provided to the chamber.

Certain embodiments of depositing a p-type microcrystalline silicon contact layer, such as contact layer 121 of FIG. 3, may comprise providing a gas mixture of hydrogen gas to silane gas in ratio of about 200:1 or greater. Silane gas may be provided at a flow rate between about 0.1 sccm/L and about 0.8 sccm/L. Hydrogen gas may be provided at a flow rate between about 60 sccm/L and about 500 sccm/L. Trimethylboron may be provided at a flow rate between about 0.0002 sccm/L and about 0.0016 sccm/L. In other words, if trimethylboron is provided in a 0.5% molar or volume concentration in a carrier gas, then the dopant/carrier gas mixture may be provided at a flow rate between about 0.04 sccm/L and about 0.32 sccm/L. The flow rates in the present disclosure are expressed as sccm per interior chamber volume. The interior chamber volume is defined as the volume of the interior of the chamber in which a gas can occupy. For example, the interior chamber volume of chamber 400 is the volume defined by the backing plate 412 and by the walls 402 and bottom 404 of the chamber minus the volume occupied therein by the showerhead assembly (i.e., including the showerhead 410, suspension 414, center support 415) and by the substrate support assembly 430, grounding straps 431). An RF power between about 50 milliWatts/cm$^2$ and about 700 milliWatts/cm$^2$ may be provided to the showerhead. The RF powers in the present disclosure are expressed as Watts supplied to an electrode per substrate area. For example, for a RF power of 10,385 Watts supplied to a showerhead to process a substrate having dimensions of 220 cm×260 cm, the RF power would be 10,385 Watts/(220 cm×260 cm)=180 milliWatts/cm$^2$. The pressure of the chamber may be maintained between about 1 Torr and about 100 Torr, preferably between about 3 Torr and about 20 Torr, more preferably between 4 Torr and about 12 Torr. The deposition rate of the p-type microcrystalline silicon contact layer may be about 10 Å/min or more. The p-type microcrystalline silicon contact layer has a crystalline fraction between about 20 percent and about 80 percent, preferably between 50 percent and about 70 percent.

Certain embodiments of depositing a p-type amorphous silicon layer, such as the silicon layer 122 of FIG. 1, FIG. 2, or FIG. 3, may comprise providing a gas mixture of hydrogen gas to silane gas in a ratio of about 20:1 or less. Silane gas may be provided at a flow rate between about 1 sccm/L and about 10 sccm/L. Hydrogen gas may be provided at a flow rate between about 5 sccm/L and 60 sccm/L. Trimethylboron may be provided at a flow rate between about 0.005 sccm/L and about 0.05 sccm/L. In other words, if trimethylboron is provided in a 0.5% molar or volume concentration in a carrier gas, then the dopant/carrier gas mixture may be provided at a flow rate between about 1 sccm/L and about 10 sccm/L. Methane may be provided at a flow rate between about 1 sccm/L and 15 sccm/L. An RF power between about 15 milliWatts/cm$^2$ and about 200 milliWatts/cm$^2$ may be provided to the showerhead. The pressure of the chamber is maintained between about 0.1 Torr and 20 Torr, preferably between about 1 Torr and about 4 Torr. The deposition rate of the p-type amorphous silicon layer may be about 100 Å/min or more. Methane or other carbon containing compounds, such $C_3H_8$, $C_4H_{10}$, $C_2H_2$, can be used to improve the window properties (e.g. to lower absorption of solar radiation) of p-type amorphous silicon layer. Thus, an increased amount of solar radiation may be absorbed through the intrinsic layers and thus cell efficiency is improved. In the embodiment wherein trimethylboron is used to provide boron dopants in the p-type amorphous silicon layer 122, the boron dopant concentration is maintained at between about $1\times10^{18}$ atoms/cm$^2$ and about $1\times10^{20}$ atoms/cm$^2$. In the embodiment wherein the methane gas is used to provide to form the p-type layer as a silicon carbide layer, the carbon dopant concentration is controlled between about 10 atomic percent and about 20 atomic percent of the layer.

Certain embodiments of depositing an intrinsic type amorphous silicon layer, such as the silicon layer 124 of FIG. 1, FIG. 2, or FIG. 3, comprises providing a gas mixture of hydrogen gas to silane gas in a ratio of about 20:1 or less. Silane gas may be provided at a flow rate between about 0.5 sccm/L and about 7 sccm/L. Hydrogen gas may be provided at a flow rate between about 5 sccm/L and 60 sccm/L. An RF power between 15 milliWatts/cm$^2$ and about 250 milliWatts/cm$^2$ may be provided to the showerhead. The pressure of the chamber may be maintained between about 0.1 Torr and 20 Torr, preferably between about 0.5 Torr and about 5 Torr. The deposition rate of the intrinsic type amorphous silicon layer may be about 100 Å/min or more. In an exemplary embodiment, the intrinsic type amorphous silicon layer is deposited at a hydrogen to silane ratio at about 12.5:1.

In one embodiment, the deposition of the intrinsic type amorphous silicon layer, such as the silicon layer 124 of FIG. 1, FIG. 2, or FIG. 3, may include more than one step, such as multiple step deposition process. For example, prior to the bulk intrinsic type amorphous silicon layer deposition process, a p-i buffer intrinsic type amorphous silicon layer (PIB layer) 904, as depicted in FIG. 9A, may be deposited on the p-type amorphous silicon layer. The detail description of the PIB layer 904 will be further detail described below with connection to FIG. 9A. The p-i buffer intrinsic type amorphous silicon layer (PIB layer) and the bulk i-type amorphous silicon layer 124 may be deposited in a single chamber by smoothly changing process parameters during deposition to form the layers with different desired film properties. The p-i buffer intrinsic type amorphous silicon layer (PIB layer) is deposited in a manner with relatively lower RF power to minimize damage to the underlying p-type amorphous silicon layer. Additionally, since the underlying p-type amorphous silicon layer and the bulk i-type amorphous silicon layer 124 each has different film transparency and properties, the buffer i-type amorphous silicon layer may assist smoothly transiting the film properties in each layer, thereby minimizing significant change in optical band gap (OBG) and, therefore, providing a wider band gap and improving open circuit voltage of about 20 meV to 50 meV.

In one embodiment, the p-i buffer intrinsic type amorphous silicon layer (PIB layer) may be deposited by providing a gas mixture of hydrogen gas to silane gas in a ratio of about 40:1 or less, for example, less than about 30:1, for example between about 20:1 and about 30:1, such as about 25. Silane gas may be provided at a flow rate between about 0.5 sccm/L and about 5 sccm/L, such as about 2.28 sccm/L. Hydrogen gas may be provided at a flow rate between about 5 sccm/L and 80 sccm/L, such as between about 20 sccm/L and about 65 sccm/L, for example about 57 sccm/L. An RF power between 15 milliWatts/cm$^2$ and about 250 milliWatts/cm$^2$, such as between about 30 milliWatts/cm$^2$ may be provided to the showerhead. The pressure of the chamber may be maintained between about 0.1 Torr and 20 Torr, preferably between about 0.5 Torr and about 5 Torr, such as about 3 Torr. The deposition rate of the p-i buffer intrinsic type amorphous silicon layer (PIB layer) may be about 100 Å/min or more. The thickness of the p-i buffer intrinsic type amorphous silicon layer (PIB layer) is about 0 Å and about 500 Å, such as about 0 Å and about 200 Å, for example, about 100 Å. It is noted that the p-i buffer intrinsic type amorphous silicon layer (PIB layer) and the bulk intrinsic type amorphous silicon layer 124 may be integratedly deposited in a single chamber or individually deposited at separate chambers.

As the p-i buffer intrinsic type amorphous silicon layer (PIB layer) has reached to a desired thickness, the gas mixture supplied for buffer intrinsic type amorphous silicon layer 124 may be varied to deposit the following bulk intrinsic type amorphous silicon layer 124. During transition of deposition the p-i buffer intrinsic type amorphous silicon layer (PIB layer) to the bulk intrinsic type amorphous silicon layer 124, the hydrogen gas supplied in the gas mixture is gradually decreased and the silane gas may remain the same or gradually increased. In one embodiment, the hydrogen to silane gas ratio in the gas mixture is changed from 25:1 to about 12.5:1 to transit deposition of the p-i buffer intrinsic type amorphous silicon layer (PIB layer) to the deposition of the bulk intrinsic type amorphous silicon layer 124. The RF power may be gradually ramped up to from about 30 milliWatts/cm$^2$ for p-i buffer intrinsic type amorphous silicon layer (PIB layer) deposition to about 50 milliWatts/cm$^2$ for bulk intrinsic type amorphous silicon layer deposition. The process pressure may be maintained substantially the same or gradually adjusted from about 3 Torr to about 2.5 Torr.

Certain embodiments of depositing an n-type amorphous silicon buffer layer, such as the silicon layer 125 of FIG. 2, comprise providing hydrogen gas to silicon gas in a ratio of about 20:1 or less. Silane gas may be provided at a flow rate between about 1 sccm/L and about 10 sccm/L. Hydrogen gas may be provided at a flow rate between about 4 sccm/L and about 50 sccm/L. Phosphine may be provided at a flow rate between about 0.0005 sccm/L and about 0.0075 sccm/L. In other words, if phosphine is provided in a 0.5% molar or volume concentration in a carrier gas, then the dopant/carrier gas mixture may be provided at a flow rate between about 0.1 sccm/L and about 1.5 sccm/L. An RF power between about 15 milliWatts/cm$^2$ and about 250 milliWatts/cm$^2$ may be provided to the showerhead. The pressure of the chamber may be maintained between about 0.1 Torr and 20 Torr, preferably between about 0.5 Torr and about 4 Torr. The deposition rate of the n-type amorphous silicon buffer layer may be about 200 Å/min or more. In the embodiment wherein phosphine is used to provide phosphorous dopants in the n-type amorphous silicon layer, the phosphorous dopant concentration is maintained at between about $1\times10^{18}$ atoms/cm$^2$ and about $1\times10^{20}$ atoms/cm$^2$.

Certain embodiments of depositing a n-type microcrystalline silicon layer, such as the silicon layer 126 of FIG. 1, FIG. 2, or FIG. 3, may comprise providing a gas mixture of hydrogen gas to silane gas in a ratio of about 100:1 or more. Silane gas may be provided at a flow rate between about 0.1 sccm/L and about 0.8 sccm/L, such as about 0.35 sccm/L. Hydrogen gas may be provided at a flow rate between about 30 sccm/L and about 250 sccm/L, such as about 71.43 sccm/L. Phosphine may be provided at a flow rate between about 0.0005 sccm/L and about 0.006 sccm/L. In other words, if phosphine is provided in a 0.5% molar or volume concentration in a carrier gas, then the dopant/carrier gas may be provided at a flow rate between about 0.1 sccm/L and about 1.2 sccm/L. An RF power between about 100 milliWatts/cm$^2$ and about 900 milliWatts/cm$^2$ may be provided to the showerhead. The pressure of the chamber may be maintained between about 1 Torr and about 100 Torr, preferably between about 3 Torr and about 20 Torr, more preferably between 4 Torr and about 12 Torr. The deposition rate of the n-type microcrystalline silicon layer may be about 50 Å/min or more. The n-type microcrystalline silicon layer has a crystalline fraction between about 20 percent and about 80 percent, preferably between 50 percent and about 70 percent. In the embodiment wherein phosphine is used to provide phosphorous dopants in the n-type microcrystalline silicon layer, the phosphorous dopant concentration is maintained at between about $1\times10^{18}$ atoms/cm$^2$ and about $1\times10^{20}$ atoms/cm$^2$.

In another embodiment of depositing a n-type microcrystalline silicon layer, such as the silicon layer 126 of FIG. 1, FIG. 2, or FIG. 3, the deposition process may comprise providing a gas mixture of hydrogen gas to silane gas in a ratio of about 500:1 or less, such as between about 100:1 and about 400:1, for example about 304:1 or about 203:1. Silane gas may be provided at a flow rate between about 0.1 sccm/L and about 0.8 sccm/L, such as between about 0.32 sccm/L and about 0.45 sccm/L. Hydrogen gas may be provided at a flow rate between about 30 sccm/L and about 250 sccm/L, such as between about 68 sccm/L and about 142.85 sccm/L. Phosphine may be provided at a flow rate between about 0.0005 sccm/L and about 0.025 sccm/L, such as between about 0.0025 sccm/L and about 0.015 sccm/L, such as about 0.005 sccm/L. In other words, if phosphine is provided in a 0.5% molar or volume concentration in a carrier gas, then the dopant/carrier gas may be provided at a flow rate between about 0.1 sccm/L and about 5 sccm/L, such as between about 0.5 sccm/L and about 3 sccm/L, such as between about 0.9 sccm/L and about 1.088 sccm/L. An RF power between about 100 milliWatts/cm$^2$ and about 900 milliWatts/cm$^2$, such as about 370 milliWatts/cm$^2$, may be provided to the showerhead. The pressure of the chamber may be maintained between about 1 Torr and about 100 Torr, preferably between about 3 Torr and about 20 Torr, more preferably between 4 Torr and about 12 Torr, for example, about 6 Torr or about 9 Torr. The deposition rate of the n-type microcrystalline silicon layer may be about 150 Å/min or more.

Certain embodiments of depositing a p-type microcrystalline silicon layer, such as silicon layer 132 of FIG. 1, FIG. 2, or FIG. 3, comprises providing a gas mixture of hydrogen gas to silane gas in a ratio of about 200:1 or greater. Silane gas may be provided at a flow rate between about 0.1 sccm/L and about 0.8 sccm/L. Hydrogen gas may be provided at a flow rate between about 60 sccm/L and about 500 sccm/L. Trimethylboron may be provided at a flow rate between about 0.0002 sccm/L and about 0.0016 sccm/L. In other words, if trimethylboron is provided in a 0.5% molar or volume concentration in a carrier gas, then the dopant/carrier gas mixture may be provided at a flow rate between about 0.04 sccm/L and about 0.32 sccm/L. An RF power between about 50 milliWatts/cm$^2$ and about 700 milliWatts/cm$^2$ may be provided to the showerhead. The pressure of the chamber may be maintained between about 1 Torr and about 100 Torr, preferably between about 3 Torr and about 20 Torr, more preferably between 4 Torr and about 12 Torr. The deposition rate of the p-type microcrystalline silicon layer may be about 10 Å/min or more. The p-type microcrystalline silicon contact layer has a crystalline fraction between about 20 percent and about 80 percent, preferably between 50 percent and about 70 percent. In the embodiment wherein trimethylboron is used to provide boron dopants in the p-type microcrystalline silicon layer, the boron dopant concentration is maintained at between about $1 \times 10^{18}$ atoms/cm$^2$ and about $1 \times 10^{20}$ atoms/cm$^2$.

In yet another embodiment of depositing a p-type microcrystalline silicon layer, such as silicon layer 132 of FIG. 1, FIG. 2, or FIG. 3, the deposition process may comprise providing a gas mixture of hydrogen gas to silane gas in a ratio of about 1000:1 or less, such as between about 200:1 and about 800:1, for example about 601:1 or about 401:1. Silane gas may be provided at a flow rate between about 0.1 sccm/L and about 0.8 sccm/L, such as about 0.2 sccm/L and about 0.38 sccm/L. Hydrogen gas may be provided at a flow rate between about 60 sccm/L and about 500 sccm/L, such as about 142.85 sccm/L. Trimethylboron may be provided at a flow rate between about 0.0002 sccm/L and about 0.0016 sccm/L, such as about 0.00115 sccm/L. In other words, if trimethylboron is provided in a 0.5% molar or volume concentration in a carrier gas, then the dopant/carrier gas mixture may be provided at a flow rate between about 0.04 sccm/L and about 0.32 sccm/L, such as between about 0.23 sccm/L. An RF power between about 50 milliWatts/cm$^2$ and about 700 milliWatts/cm$^2$, such as between about 290 milliWatts/cm$^2$ and about 440 milliWatts/cm$^2$ may be provided to the showerhead. The pressure of the chamber may be maintained between about 1 Torr and about 100 Torr, preferably between about 3 Torr and about 20 Torr, more preferably between 4 Torr and about 12 Torr, such as about 9 Torr or about 7 Torr. The deposition rate of the p-type microcrystalline silicon layer may be about 143 Å/min or more.

Certain embodiments of depositing an intrinsic type microcrystalline silicon layer, such as silicon layer 134 of FIG. 1, FIG. 2, or FIG. 3, may comprise providing a gas mixture of silane gas to hydrogen gas in a ratio between 1:20 and 1:200. Silane gas may be provided at a flow rate between about 0.5 sccm/L and about 5 sccm/L. Hydrogen gas may be provided at a flow rate between about 40 sccm/L and about 400 sccm/L. In certain embodiments, the silane flow rate may be ramped up from a first flow rate to a second flow rate during deposition. In certain embodiments, the hydrogen flow rate may be ramped down from a first flow rate to a second flow rate during deposition. An RF power between about 300 milliWatts/cm$^2$ or greater, preferably 600 milliWatts/cm$^2$ or greater, may be provided to the showerhead. In certain embodiments, the power density may be ramped down from a first power density to a second power density during deposition. The pressure of the chamber is maintained between about 1 Torr and about 100 Torr, preferably between about 3 Torr and about 20 Torr, more preferably between about 4 Torr and about 12 Torr. The deposition rate of the intrinsic type microcrystalline silicon layer may be about 200 Å/min or more, preferably 500 Å/min. Methods and apparatus for deposited microcrystalline intrinsic layer are disclosed in U.S. patent application Ser. No. 11/426,127 filed Jun. 23, 2006, entitled "Methods and Apparatus for Depositing a Microcrystalline Silicon Film for Photovoltaic Device," which is incorporated by reference in its entirety to the extent not inconsistent with the present disclosure. The microcrystalline silicon intrinsic layer has a crystalline fraction between about 20 percent and about 80 percent, preferably between 55 percent and about 75 percent. It was surprising to find that a microcrystalline silicon intrinsic layer having a crystalline fraction of about 70% or below provided an increase in open circuit voltage and leads to higher cell efficiency.

In yet another embodiment of depositing an intrinsic type microcrystalline silicon layer, such as silicon layer 134 of FIG. 1, FIG. 2, or FIG. 3, the intrinsic type microcrystalline silicon layer may be deposited by one or more steps, e.g. multiple deposition steps. As the crystalline fraction may be varied along with the increase in the thickness of the deposited film, the gas ratio supplied during the deposition may be varied to maintain the crystalline fraction of the overall intrinsic type microcrystalline silicon layer. Accordingly, the deposition may be performed in multiple steps using different process parameters or process variables to form different crystalline fractions in the resultant film. Multiple deposition steps enable the intrinsic type microcrystalline silicon layer to be formed as a gradient film that have different desired film properties at different thickness levels within the film. In one embodiment, the process parameters, or process variables, that may be varied in each deposition step include RF power, deposition time, hydrogen to silane gas ratio supplied in the gas mixture, gas species supplied in the gas mixture, process pressure, gas flow rate, spacing, RF frequency, and/or other suitable process parameters. In one embodiment, the process variables of hydrogen gas to silane gas ratio, the process pressure, RF power, or deposition time may be varied to control crystalline fraction formed in different parts of a formed intrinsic type microcrystalline silicon layer. In another embodiment, the process variable of hydrogen to silane gas ratio is varied in each deposition step to control crystalline fraction formed in different parts of a formed intrinsic type microcrystalline silicon layer.

In one embodiment, the numbers of the steps performed in the deposition process may be determined by the desired thickness of the intrinsic type microcrystalline silicon layer. For example, if the intrinsic type microcrystalline silicon layer is desired to be deposited with a relatively greater thickness, greater than 5000 Å, the overall process may be divided into more steps to maintain the uniform crystalline fraction of the film. In contrast, if the intrinsic type microcrystalline silicon layer is desired to be deposited with a thinner thickness, the number of the steps in the deposition process may be controlled at a suitable range.

In an exemplary embodiment wherein the intrinsic type microcrystalline silicon layer is formed with a thickness of about 17000 Å, the deposition process may be divided into four steps, with a different ratio of hydrogen to silane gas in the gas mixture in each of the deposition steps. The thickness formed in each step may be controlled to be substantially equal to about 4250 Å (e.g., 17000 Å total thickness/4 deposition steps=4250 Å per step) in each step. During deposition, the gas ratio of hydrogen gas to silane gas is gradually decreased in each successive step to efficiently maintain the overall crystalline fraction of the deposited film within a predetermined range to prevent the overall crystalline fraction of the film from increasing as the thickness of the overall film increases. The low ratio of hydrogen gas to silane gas may be achieved by decreasing the amount of hydrogen gas supplied in the gas mixture, and/or increasing the amount of silane gas provided in the gas mixture. The ratio as discussed here is the flow rate ratio (e.g., volume ratio) supplied into the processing chamber. In one specific embodiment, the gas ratio of hydrogen gas to silane gas may be controlled at about 100:1 in the first step, 95:1 in the second step, 90:1 in the third step, and 85:1 in the fourth/final step of the deposition process. It is noted that the gas ratio of hydrogen gas to silane gas may be adjusted between about 20:1 and 200:1 as desired to suit different process regimes. In one embodiment, in adjusting the gas flow during deposition, the silane gas flow may be kept constant while gradually reducing the hydrogen flow supplied in the gas mixture, resulting in lower hydrogen gas to silane gas ratio in the gas mixture which lowers the crystalline fraction formed in the intrinsic type microcrystalline silicon layer, or vise versa. Other process parameters, such as gas pressure, substrate temperature, RF power and the like may be maintained substantially the same during each deposition step.

In one embodiment, silane gas may be provided at a flow rate between about 0.1 sccm/L and about 5 sccm/L, such as about 0.97 sccm/L. Hydrogen gas may be provided at a flow rate between about 10 sccm/L and about 200 sccm/L, such as between about 80 sccm/L and about 105 sccm/L. In an exemplary embodiment wherein the deposition has multiple steps, such as four steps, the hydrogen gas flow may be configured at about 97 sccm/L in the first step, and gradually reduced to 92 sccm/L, 87.5 sccm/L, and 82.6 sccm/L respectively in the subsequent process steps. An RF power between about 300 milliWatts/cm$^2$ or greater, such as about 490 milliWatts/cm$^2$ may be provided to the showerhead. The pressure of the chamber is maintained between about 1 Torr and about 100 Torr, for example between about 3 Torr and about 20 Torr, such as between about 4 Torr and about 12 Torr, such as about 9 Torr. The deposition rate of the intrinsic type microcrystalline silicon layer may be about 200 Å/min or more, such as 400 Å/min.

Certain embodiments of a method depositing a n-type amorphous silicon layer, such as the silicon layer 136 of FIG. 1, FIG. 2, or FIG. 3, may comprise depositing an optional first n-type amorphous silicon layer at a first silane flow rate and depositing a second n-type amorphous silicon layer over the first optional n-type amorphous silicon layer at a second silane flow rate lower than the first silane flow rate. The first optional n-type amorphous silicon layer may comprise providing a gas mixture of hydrogen gas to silane gas in a ratio of about 20:1 or less, such as about 5:5:1. Silane gas may be provided at a flow rate between about 1 sccm/L and about 10 sccm/L, such as about 5.5 sccm/L. Hydrogen gas may be provided at a flow rate between about 4 sccm/L and about 40 sccm/L, such as about 27 sccm/L. Phosphine may be provided at a flow rate between about 0.0005 sccm/L and about 0.0015 sccm/L, such as about 0.0095 sccm/L. In other words, if phosphine is provided in a 0.5% molar or volume concentration in a carrier gas, then the dopant/carrier gas mixture may be provided at a flow rate between about 0.1 sccm/L and about 3 sccm/L, such as about 1.9 sccm/L. An RF power between 25 milliWatts/cm$^2$ and about 250 milliWatts/cm$^2$, such as about 80 milliWatts/cm$^2$, may be provided to the showerhead. The pressure of the chamber may be maintained between about 0.1 Torr and about 20 Torr, preferably between about 0.5 Torr and about 4 Torr, such as about 1.5 Torr. The deposition rate of the first n-type amorphous silicon layer may be about 200 Å/min or more, such as about 561 Å/min. In the embodiment wherein phosphine is used to provide phosphorous dopants in the n-type amorphous silicon layer, the phosphorous dopants concentration is maintained at between about $1 \times 10^{18}$ atoms/cm$^2$ and about $1 \times 10^{20}$ atoms/cm$^2$.

The second n-type amorphous silicon layer deposition may comprise providing a gas mixture of hydrogen gas to silane gas in a ratio of about 20:1 or less, such about 7.8:1. Silane gas may be provided at a flow rate between about 0.1 sccm/L and about 5 sccm/L, such as about 0.5 sccm/L and about 3 sccm/L, for example about 1.42 sccm/L. Hydrogen gas may be provided at a flow rate between about 1 sccm/L and about 10 sccm/L, such as about 6.42 sccm/L. Phosphine may be provided at a flow rate between 0.01 sccm/L and about 0.075 sccm/L, such as about 0.015 sccm/L and about 0.03 sccm/L, for example about 0.023 sccm/L. In other words, if phosphine is provided in a 0.5% molar or volume concentration in a carrier gas, then the dopant/carrier gas mixture may be provided at a flow rate between about 2 sccm/L and about 15 sccm/L, such as about 3 sccm/L and about 6 sccm/L, for example about 4.71 sccm/L. An RF power between 25 milliWatts/cm$^2$ and about 250 milliWatts/cm$^2$, such as about 60 milliWatts/cm$^2$, may be provided to the showerhead. The pressure of the chamber may be maintained between about 0.1 Torr and about 20 Torr, preferably between about 0.5 Torr and about 4 Torr, for example about 1.5 Torr. The deposition rate of the second n-type amorphous silicon layer may be about 100 Å/min or more, such as about 300 Å/min. The thickness of the second n-type amorphous silicon layer is less than o about 300 Å, such as about 20 Å and about 150 Å, for example about 80 Å. The second n-type amorphous silicon layer is heavily doped and has a resistivity of about 500 Ohm-cm or below. It is believed that the heavily (e.g., degenerately) n-type doped amorphous silicon provides improved ohmic contact with a TCO layer, such as layer TCO layer 140. Thus, cell efficiency is improved. The optional first n-type amorphous silicon is used to increase the deposition rate for the entire n-type amorphous silicon layer. It is understood that the n-type amorphous silicon layer may be formed without the optional first n-type amorphous silicon and may be formed primarily of the heavily (e.g., degenerately) doped second n-type amorphous layer.

It is noted that prior to each deposition of the layers, including n-type, intrinsic type and p-type silicon containing layers, an optional hydrogen or argon plasma gas treatment process may be performed. The hydrogen treatment process may be performed to treat the underlying layer to suppress surface contamination. Furthermore the plasma treatment process can also improve electrical properties at the interface since the surface defects may be removed or eliminated during the treatment process. In one embodiment, the plasma treatment process may be performed by supplying a hydrogen gas or argon gas into the processing chamber. The gas flow for supplying the hydrogen gas or the argon gas is between about 10 sccm/L and about 45 sccm/L, such as between about 15 sccm/L and about 40 sccm/L, for example about 20 sccm/L and about 36 sccm/L. In one example, the hydrogen gas may be supplied at about 21.42 sccm/L or the argon gas may be supplied at about 35.7 sccm/L. The RF power supplied to do the treatment process may be controlled at between about 25 milliWatts/cm$^2$ and about 250 milliWatts/cm$^2$, such as about 60 milliWatts/cm$^2$, may be provided to the showerhead 10 milliWatts/cm$^2$ and about 250 milliWatts/cm$^2$, such as about 80 milliWatts/cm$^2$ for hydrogen treatment and about 25 milliWatts/cm$^2$ for argon treatment.

In one embodiment, an argon treatment process is performed prior to deposition of a p-type amorphous silicon layer. In one embodiment, a hydrogen treatment process may be performed prior to deposition of each of the intrinsic type amorphous silicon layer, n-type microcrystalline silicon layer, p-type microcrystalline silicon layer, and intrinsic type microcrystalline silicon layer and other layers when beneficial.

Figure 8A:
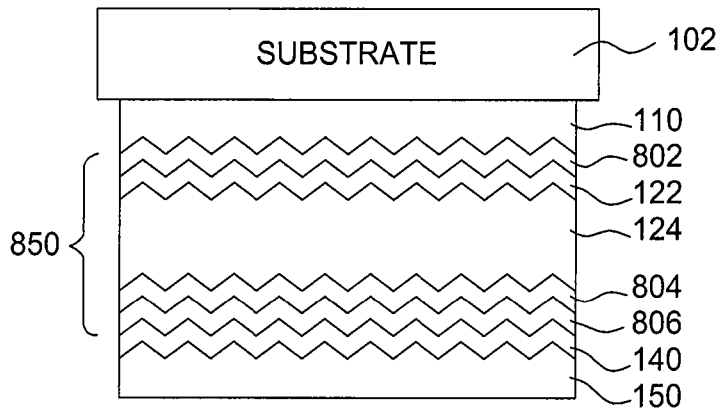
FIGS. 8A-C depicts schematic diagrams of different embodiments of single junction solar cells.
Figure 8B:
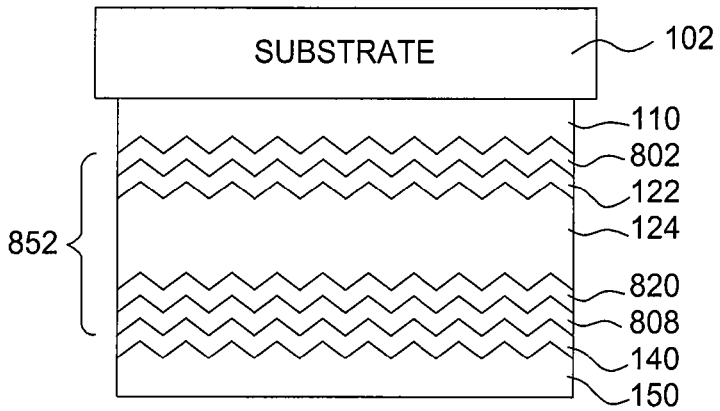
Figure 8C:
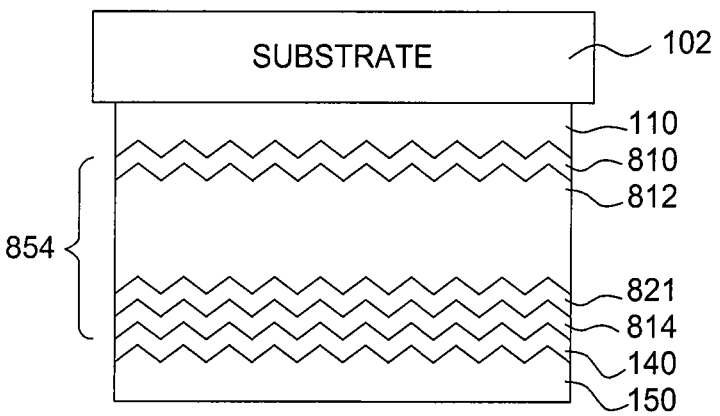

FIGS. 8A-C schematically illustrate various embodiments of a solar cell. Although the embodiments depicted in FIGS. 8A-C illustrate a single junction solar cell, it should be noted that the layers as depicted could be part of a tandem, triple or larger junction solar cell formed using different materials, including but not limited to polysilicon, amorphous silicon, microcrystalline silicon or any combinations thereof fabricated by the methods described herein.

FIG. 8A depicts a substrate 102 having a solar cell 850 disposed on a TCO layer 110. The solar cell 850 has a p-type amorphous silicon layer 122, an intrinsic type amorphous layer 124 and a n-type amorphous layer 804. Prior to deposition of the p-type amorphous silicon layer 122, a preliminary p-type amorphous silicon layer 802 may be formed on the substrate 102. The preliminary p-type amorphous silicon layer 802 is formed by controlling the silane flow rate during the p-type amorphous silicon layer deposition process. During deposition, a first silane flow rate may be supplied to deposit the preliminary p-type amorphous silicon layer 802 and a second silane flow rate to deposit the p-type amorphous silicon layer 122 over the preliminary p-type amorphous silicon layer 802. The second silane flow rate may be controlled at a higher flow rate than the first silane flow rate.

The resultant preliminary p-type amorphous silicon layer 802 is heavily (e.g., degenerately) doped p-type amorphous silicon layer and has a resistivity of about 10$^5$ Ohm-cm or lower. It is believed that the heavily (e.g., degenerately) doped preliminary p-type amorphous silicon layer 802 provides improved ohmic contact with a TCO layer, such as the TCO layer 110. The heavily doped preliminary p-type amorphous silicon layer 802 provides a reduced width of depletion region (e.g., potential barrier between the TCO layer 110 and the solar cell 850), thus, tunneling of effective current transport is thereby promoted. Moreover, the high amount of acceptor-like elements existing in the heavily doped preliminary p-type amorphous silicon layer 802 also lowers the potential barrier at the interface of the TCO layer 110 and the solar cell 850. Accordingly, the p-type amorphous silicon layer 122 serves as a wide bandgap layer. Thus, cell efficiency is improved. The p-type amorphous silicon layer 122 is used to increase the deposition rate for the entire p-type silicon formation process. It is understood that the p-type amorphous silicon layer 122 may also be formed from the same heavily doped preliminary p-type amorphous silicon 802 material.

The heavily doped preliminary p-type amorphous silicon layer 802 deposition process may comprise providing a gas mixture of hydrogen gas to silane gas in a ratio of about 20:1 or less. Silane gas may be provided at a flow rate between about 0.5 sccm/L and about 5 sccm/L. Hydrogen gas may be provided at a flow rate between about 1 sccm/L and about 50 sccm/L. Trimethylboron may be provided at a flow rate between 0.0025 sccm/L and about 0.15 sccm/L. In other words, if trimethylboron is provided in a 0.5% molar or volume concentration in a carrier gas, then the dopant/carrier gas mixture may be provided at a flow rate between about 0.5 sccm/L and about 30 sccm/L. An RF power between 15 milliWatts/cm$^2$ and about 250 milliWatts/cm$^2$ may be provided to the showerhead. The pressure of the chamber may be maintained between about 0.1 Torr and about 20 Torr, such as between about 0.5 Torr and about 4 Torr. The deposition rate of the preliminary p-type amorphous silicon layer 802 may be about 100 Å/min or more. In one embodiment, the heavily doped p-type amorphous silicon layer 802 has a dopant concentration between about 10$^{20}$ atoms per cubic centimeter and about 10$^{21}$ atoms per cubic centimeter.

In one embodiment, the p-type amorphous silicon layer 122 may be fabricated similar manner as descried with referenced to FIGS. 1-3.

Similarly, for a n-type amorphous silicon layer 804 deposition process, the process may include a two step deposition process to deposit the n-type amorphous silicon layer 804 along with a heavily doped amorphous silicon layer 806. The two step depositing process is similar to the deposition process of the n-type amorphous silicon layer 136 discussed with referenced to FIGS. 1-3. Alternatively, the n-type amorphous silicon layer 804 may be formed primary as the heavily doped n-type amorphous silicon layer 806 to provide improved ohmic contact with a TCO layer, such as with the TCO layer 140. In one embodiment, the heavily doped n-type amorphous silicon layer 806 has a dopant concentration between about 10$^{20}$ atoms per cubic centimeter and about 10$^{21}$ atoms per cubic centimeter.

In one embodiment, the p-type amorphous silicon layer 122 has a thickness between about 50 Å and about 200 Å and the heavily doped p-type amorphous silicon layer 802 has a thickness between about 10 Å and about 50 Å. The n-type amorphous silicon layer 804 has a thickness between about 100 Å and about 400 Å and the heavily doped n-type amorphous silicon layer 806 has a thickness between about 50 Å and about 200 Å.

FIG. 8B depicts another embodiment of the solar cell 852 disposed on the substrate 102. Similar to the solar cell 850 of FIG. 8A, the solar cell 852 includes the heavily doped p-type amorphous silicon layer 802, p-type amorphous silicon layer 122 and intrinsic type amorphous silicon layer 124, as of FIG. 8A, an n-type amorphous silicon buffer layer 820 and an n-type microcrystalline silicon layer 808. The n-type amorphous silicon buffer layer 820 is a layer similar to the buffer layer 125 of FIG. 2 and may be formed between the intrinsic type amorphous silicon layer 124 and the n-type microcrystalline silicon layer 808. The n-type amorphous silicon buffer layer 820 assists bridging the bandgap offset that may occur between the intrinsic type silicon layer 124 and the n-type silicon layer 808. Thus, it is believed that cell efficiency is improved due to enhanced current collection. These layers 802, 122, 124, 808 may be fabricated by any suitable process, such as the processes described above.

FIG. 8C depicts yet another embodiment of solar cell 854 disposed on the substrate 102. Similar to the structure of the cells described above, the solar cell 854 includes a p-type microcrystalline silicon layer 810, an intrinsic type microcrystalline silicon layer 812, a n-type amorphous silicon barrier layer 821 and a n-type microcrystalline silicon layer 814. The n-type amorphous silicon barrier layer 821 serves as a barrier layer formed between the intrinsic type microcrystalline silicon layer 812 and the n-type microcrystalline silicon layer 814. The n-type amorphous silicon barrier layer 821 assists increasing the film lateral resistivity and avoiding peripheral current issues. In one embodiment, the n-type amorphous silicon barrier layer 821 may be deposited in a manner similar to the deposition manners of the n-type amorphous silicon buffer layer 820 of FIG. 8B and the buffer layer 125 of FIG. 2. The n-type amorphous silicon barrier layer 821 may be fabricated in a manner having film components similar to the buffer layers 820, 125. Since the barrier layer 821 contacts microcrystalline based silicon film (e.g., intrinsic type microcrystalline silicon layer 812 and a n-type microcrystalline silicon layer 814) instead of amorphous silicon films that the buffer layers 820, 125 are in contact with, the barrier layer 821 serves to increase the film lateral resistivity and avoiding peripheral current issues.

In the embodiments wherein one or more, e.g., multiple, junctions are desired, the solar cell 850 of FIG. 8A may be configured as a top cell in contact with the substrate and the solar cell 854 of FIG. 8C may be configured as a bottom cell disposed on the top solar cell 850. As the top cell is desired to provide a higher bandgap, the intrinsic type amorphous silicon layer 124 of solar cell 850 may provide a higher bandgap than the intrinsic type microcrystalline silicon layer 812 is the solar cell 854. Alternatively, the arrangement of the cells may be configured in any suitable manners to achieve desired cell performance.

Figure 9:
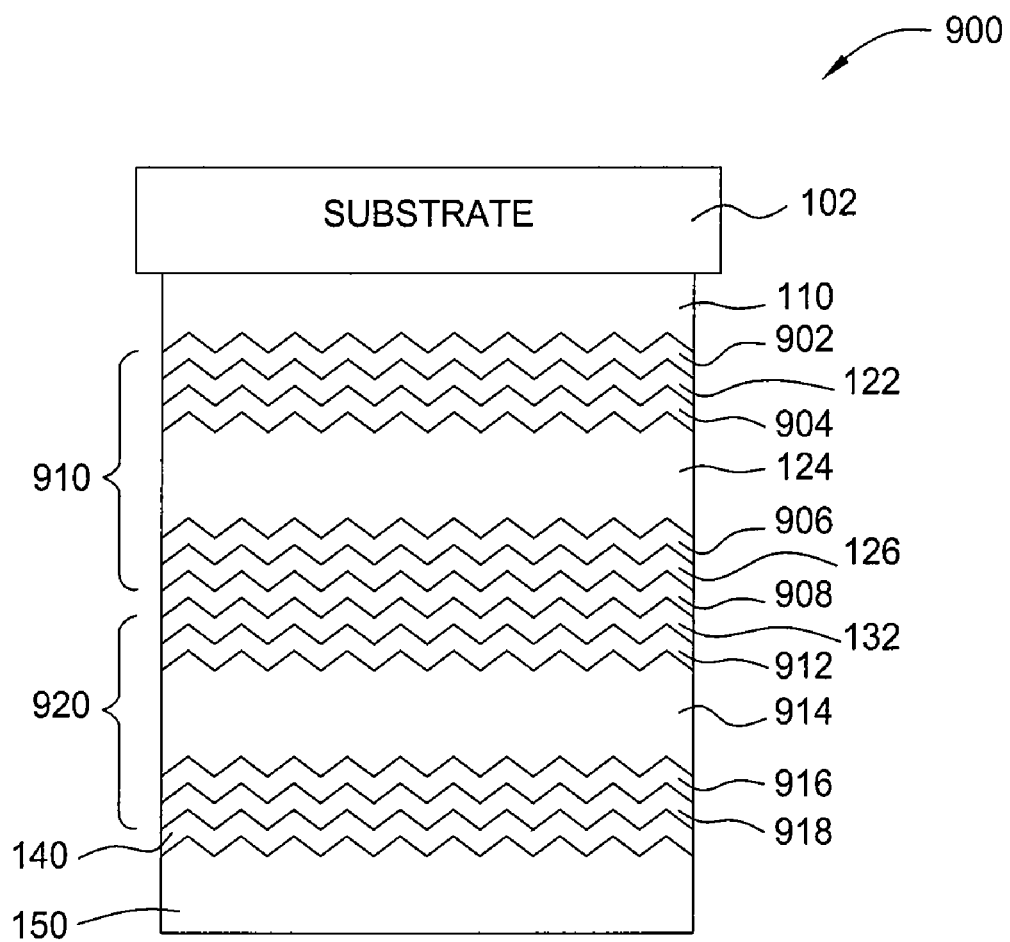
FIG. 9 depicts a schematic diagrams of different embodiments of single junction solar cells.

FIG. 9 depicts another exemplary embodiment of a multi-junction solar cell 900 comprising a number of different contact layer, buffer layer, or interfacial layers disposed within the cell 900. The cell 900 includes a first junction 910 and a second junction 902 disposed on the substrate 102 having the TCO layer 110 disposed on the substrate 102. An interfacial layer 908 may be deposited in between the first junction 910 and the second junction 920. The interfacial layer 908 is deposited to improve interface contact resistance and conductivity and provide wider optical bandgap. Additionally, the material of the interfacial layer 908 is selected so that the reflective index (RI) and light absorption of the layer 908 may be adjusted to provide different electrical properties and light trapping efficiencies for different device requirements. In one embodiment, suitable materials for forming the interfacial layer 908 include SiON, SiN, SiC, SiO SiOC, SiCN, and other suitable carbon, oxygen or nitrogen containing silicon based materials or silicon alloys. In one embodiment, the interfacial layer 908 is a silicon carbon (SiC), silicon oxide (SiO) or silicon oxynitride (SiON) layer. The reflective index (RI) of the interfacial layer 908 may be adjusted by varying the gas mixture supplied to deposit the layer 908 during deposition. As the gas mixture supplied for deposition varies, the carbon or nitrogen dopants formed in the deposited interfacial layer 908 may differ as well so that the resultant film may have a desired film bandgap, light absorbability, and crystalline fraction. As the film bandgap and light absorbability improve, the cell conversion efficiency is increased accordingly. Furthermore, the interfacial layer 908 may also be used at any interface where the junction is in contact with a TCO layer, a metal back plate and/or with a substrate.

In the embodiment depicted in FIG. 9, the interfacial layer 908 is disposed between the first junction 910 and the second junction 920. The first junction comprises a first upper interfacial layer 902, a p-type amorphous silicon layer 233, a PIB layer 904, an i-type amorphous silicon layer 124, a n-type amorphous silicon buffer layer 906 and a n-type microcrystalline silicon layer 126. In one embodiment, the first upper interfacial layer 902 may have similar film properties as the interfacial layer 908 described above. Alternatively, the first upper interfacial layer 902 may be similar to the p-type microcrystalline silicon contact layer 121, the heavily (e.g., degenerately) doped preliminary p-type amorphous silicon layer 802, the p-type microcrystalline silicon layer 810, or a p-type amorphous silicon layer described above with referenced to FIG. 1-3 and FIG. 8A-C. In another embodiment, the PIB layer 904 may be similar to the p-i buffer intrinsic type amorphous silicon layer (PIB layer) as described above. The n-type amorphous silicon buffer layer 906 may be similar to the amorphous silicon buffer layer 820, 821 or the buffer layer 125 with referenced to FIGS. 8B-C and FIG. 2.

The second junction 920 includes the p-type microcrystalline silicon layer 132, an optional PIB layer 912, a intrinsic type microcrystalline silicon layer 914, a n-type amorphous silicon layer 916 and a second lower interfacial layer 918. The second lower interfacial layer 918 may be similar to the interfacial layer 908 described above. Alternatively, the second lower interfacial layer 918 may be similar to the heavily (e.g., degenerately) doped amorphous silicon layer 806, or n-type microcrystalline silicon layer 814 with referenced to FIGS. 8B-C, or other similar n-type contact layer described above. The p-type microcrystalline silicon layer 132 has been described above with referenced to FIGS. 1-3. The optional PIB layer 912 may be similar to the p-i buffer intrinsic type amorphous silicon layer (PIB layer) as described above. Alternatively, since the PIB layer 912 is in contact with the p-type microcrystalline silicon layer (e.g., the p-type microcrystalline silicon layer 132), the optional PIB layer 912 may be deposited as microcrystalline silicon based or amorphous silicon based material as needed. The deposition process for depositing the optional PIB layer 912 may be deposited as microcrystalline silicon based or amorphous silicon based material may be selected from any intrinsic type silicon based deposition process as described above. The intrinsic type microcrystalline silicon layer 914 may be deposited as a single step or multiple steps as described above. In one particular embodiment, the intrinsic type microcrystalline silicon layer 914 is deposited using a four step process by gradually tuning the hydrogen to silane ratio in the gas mixture to provide a uniform crystalline fraction formed in the resultant film as described above. The n-type amorphous silicon layer 916 may be similar to the n-type amorphous silicon layer 136, 804 as described above with referenced to FIGS. 1-3 and FIG. 8A.

The second TCO layer 140 and the back electrode layer 150 may be subsequently disposed over the second junction 920 to complete the junction formation process.

Figure 5:
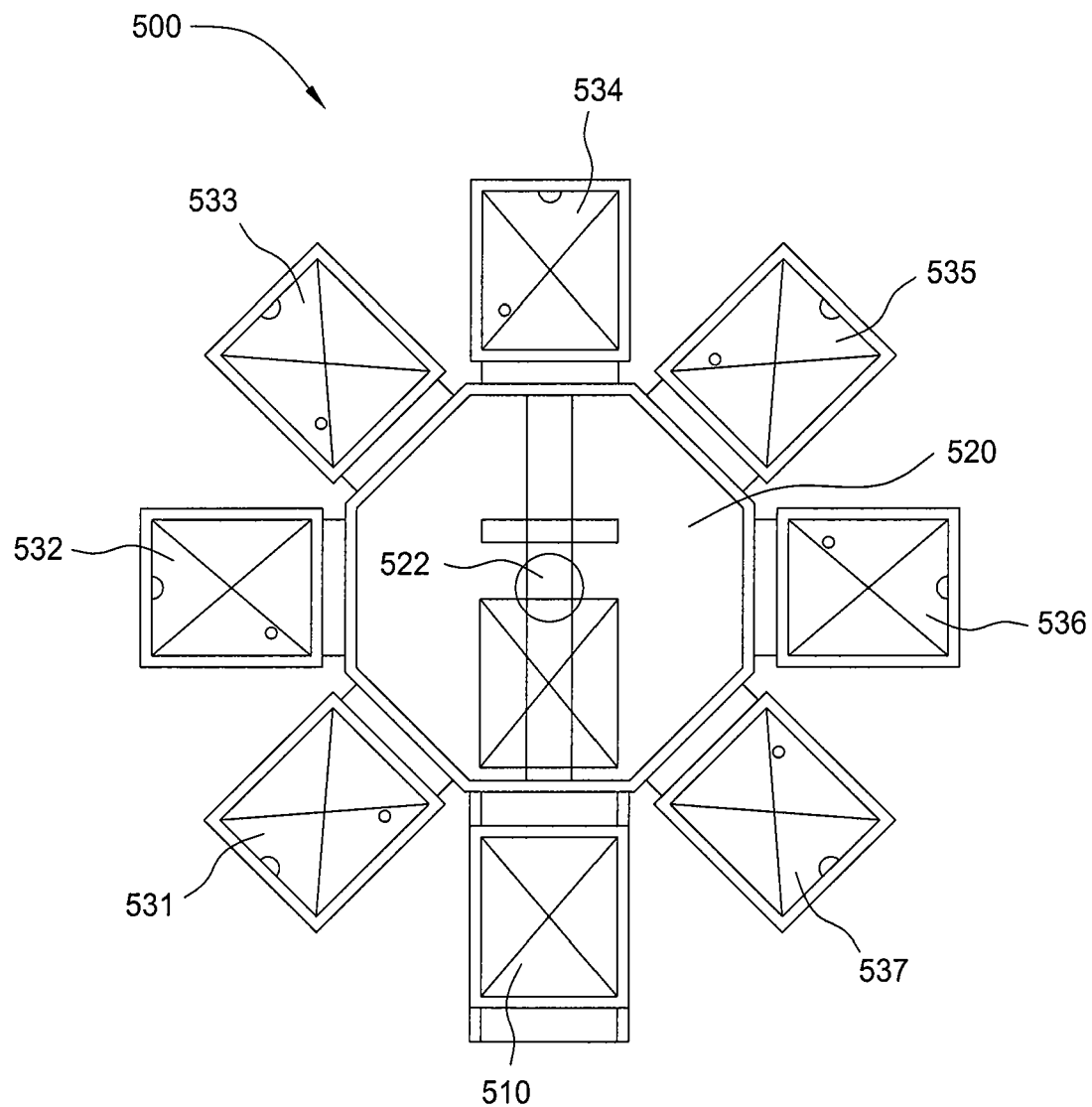
FIG. 5 is a top schematic view of one embodiment of a process system having a plurality of process chambers.

FIG. 5 is a top schematic view of one embodiment of a process system 500 having a plurality of process chambers 531-537, such as PECVD chambers chamber 400 of FIG. 4 or other suitable chambers capable of depositing silicon films. The process system 500 includes a transfer chamber 520 coupled to a load lock chamber 510 and the process chambers 531-537. The load lock chamber 510 allows substrates to be transferred between the ambient environment outside the system and vacuum environment within the transfer chamber 520 and process chambers 531-537. The load lock chamber 510 includes one or more evacuatable regions holding one or more substrate. The evacuatable regions are pumped down during input of substrates into the system 500 and are vented during output of the substrates from the system 500. The transfer chamber 520 has at least one vacuum robot 522 disposed therein that is adapted to transfer substrates between the load lock chamber 510 and the process chambers 531-537. Seven process chambers are shown in FIG. 5; however, the system may have any suitable number of process chambers.

In certain embodiments of the invention, one system 500 is configured to deposit the first p-i-n junction comprising an intrinsic type amorphous silicon layer(s) of a multi-junction solar cell, such as the first p-i-n junction 120. One of the process chambers 531-537 is configured to deposit the p-type silicon layer(s) of the first p-i-n junction while the remaining process chambers 531-537 are each configured to deposit both the intrinsic type amorphous silicon layer(s) and the n-type silicon layer(s). The intrinsic type amorphous silicon layer(s) and the n-type silicon layer(s) of the first p-i-n junction may be deposited in the same chamber without any passivation process in between the deposition steps. Thus, a substrate enters the system through the load lock chamber 510, is transferred by the vacuum robot into the dedicated process chamber configured to deposit the p-type silicon layer(s), is transferred by the vacuum robot into one of the remaining process chamber configured to deposited both the intrinsic type silicon layer(s) and the n-type silicon layer(s), and is transferred by the vacuum robot back to the load lock chamber 510. In certain embodiments, the time to process a substrate with the process chamber to form the p-type silicon layer(s) is approximately 4 or more times faster, such as about 6 or more times faster, than the time to form the intrinsic type amorphous silicon layer(s) and the n-type silicon layer(s) in a single chamber. Therefore, in certain embodiments of the system to deposit the first p-i-n junction, the ratio of p-chambers to i/n-chambers is 1:4 or more, preferably 1:6 or more. The throughput of the system including the time to provide plasma cleaning of the process chambers may be about 10 substrates/hr or more, preferably 20 substrates/hr or more.

In certain embodiments of the invention, one system 500 is configured to deposit the second p-i-n junction comprising an intrinsic type microcrystalline silicon layer(s) of a multi-junction solar cell, such as the second p-i-n junction 130. One of the process chambers 531-537 is configured to deposit the p-type silicon layer(s) of the first p-i-n junction while the remaining process chambers 531-537 are each configured to deposit both the intrinsic type microcrystalline silicon layer(s) and the n-type silicon layer(s). The intrinsic type microcrystalline silicon layer(s) and the n-type silicon layer(s) of the second p-i-n junction may be deposited in the same chamber without any passivation process in between the deposition steps. In certain embodiments, the time to process a substrate with the process chamber to form the p-type silicon layer(s) is approximately 4 or more times faster than the time to form the intrinsic type microcrystalline silicon layer(s) and the n-type silicon layer(s) in a single chamber. Therefore, in certain embodiments of the system to deposit the second p-i-n junction, the ratio of p-chambers to i/n-chambers is 1:4 or more, such as about 1:6 or more. The throughput of the system including the time to provide plasma cleaning of the process chambers may be about 3 substrates/hr or more, such as about 5 substrates/hr or more.

In certain embodiments, the throughput of the system 500 for depositing the first p-i-n junction comprising an intrinsic type amorphous silicon layer is approximately 2 times or more the throughput of the system 500 for depositing the second p-i-n junction comprising an intrinsic type microcrystalline silicon layer since the thickness of the intrinsic type microcrystalline silicon layer(s) is thicker than the intrinsic type amorphous silicon layer(s). Therefore, a single system 500 adapted to deposit a first p-i-n junction comprising intrinsic type amorphous silicon layer(s) can be matched with two or more systems 500 adapted to deposit a second p-i-n junction comprising intrinsic type microcrystalline silicon layer(s). Once a first p-i-n junction has been formed on one substrate in one system, the substrate may be exposed to the ambient environment (i.e., vacuum break) and transferred to the second system. A wet or dry cleaning of the substrate between the first system depositing the first p-i-n junction and the second p-i-n junction is not necessary.

EXAMPLES

The examples disclosed herein are exemplary in nature and are not meant to limit the scope of the invention unless explicitly set forth in the claims.

Substrates having a surface area of 4,320 $cm^2$ were processed in an AKT 4300 PECVD System, available from AKT America, Inc., of Santa Clara, Calif., having an interior chamber volume of 130 liters. Layer 1 was deposited in a first chamber of the PECVD system. Layers 2-4 were deposited in a second chamber of the PECVD system. Layer 5 was deposited in a third chamber of the PECVD system. Layers 6-11 were deposited in a fourth chamber of the PECVD system. The spacing during deposition of layers 1-11 was set to 550 mil and the temperature of the substrate support was set to 200° C. The deposition parameters are set forth in the FIG. 6 to form a tandem p-i-n junction solar cell. Phosphine was provided in a 0.5% mixture in a hydrogen carrier gas. Trimethylboron was provided in a 0.5% mixture in a hydrogen carrier gas. The hydrogen gas flow rates in FIG. 6 show the hydrogen gas flow rates separate from the dopant carrier gas. The solar cell had the following properties set forth in FIG. 7.

Amorphous Deposition Processes

One aspect of the present invention includes an improved thin film silicon solar cell, and methods and apparatus for forming the same, where one or more of the layers in the solar cell comprises at least one amorphous silicon layer that has improved electrical characteristics and mechanical properties, and is capable of being deposited at rates many times faster than conventional amorphous silicon deposition processes. The improved deposition rate achieved using the methods described herein can greatly improve the substrate throughput through a solar cell substrate processing system. In one embodiment, the processes described herein are used to form an amorphous intrinsic-type layer within a thin film p-i-n solar cell, wherein the deposition rate of the amorphous intrinsic-type layer is greater than about 60 Å/min. In one embodiment, the amorphous intrinsic layer deposition rate is between about 150 Å/min and about 400 Å/min on at least a 2200 mm×2600 mm sized substrate.

The methods described herein have surprisingly been found to improve the light stability of a formed thin film solar cell, since it is believed that the use of a high pressure during the amorphous silicon deposition process will tend reduce the ion bombardment of the surface of the growing film by lowering the ion-energy and electron temperature in the generated plasma. Moreover, it is also believed that when also using a high hydrogen-gas to silane-gas ratio during processing the generation of higher order silane related chemical species is suppressed, which have been found to be detrimental to the light stability of a formed solar cell device. While the discussion below generally discusses a method of forming a single junction solar cell, this configuration is not intended to be limiting to the scope of the invention, since one or more of the process steps discussed below may be used to in combination with one or more of the steps discussed previously. In one example, the barrier layer deposition process step, intrinsic layer deposition step, power lift step, temperature stabilization step, and plasma cleaning step are used with one or more of the steps discussed above in conjunction with FIGS. 1-9.

Figure 10:
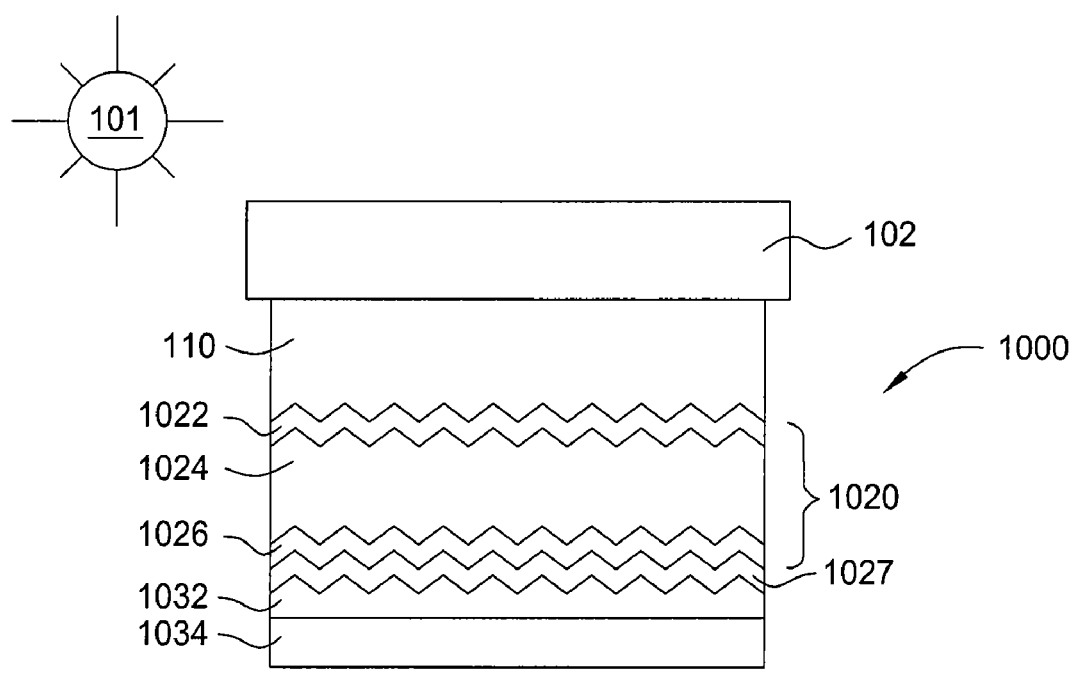
FIG. 10 is a schematic diagram of a single junction solar cell according to one embodiment of the invention.

FIG. 10 illustrates one example of a Solar cell 1000 that is formed using the processes described herein. Solar cell 1000 comprises a substrate 102, such as a glass substrate, polymer substrate, or other suitable substrate, with thin films formed thereover. The Solar cell 1000 may further comprise a first transparent conducting oxide (TCO) layer 110 formed over the substrate 102, a p-i-n junction 1020 formed over the first TCO layer 110, a second TCO layer 1032 formed over the p-i-n junction 1020, and a metal back layer 1034 formed over the second TCO layer 1032. As discussed above, to improve light absorption by increasing light trapping, the substrate and/or one or more of thin films formed thereover may be optionally textured by wet, plasma, ion, and/or mechanical processes. For example, the first TCO layer 110 in the Solar cell 1000 is textured so that the subsequent thin films deposited thereover will generally follow the topography of the surface below it. The first TCO layer 110 and the second TCO layer 1032 may each comprise tin oxide ($Sn_xO_y$), zinc oxide ($Zn_xO_y$), indium tin oxide ($In_xSn_yO_z$), cadmium stannate, combinations thereof, or other suitable materials, and may also include additional dopants and components as discussed above.

The p-i-n junction 1020 may comprise a p-type amorphous silicon layer 1022, an intrinsic type amorphous silicon layer 1024 formed over the p-type amorphous silicon layer 1022, and an n-type amorphous silicon layer 1026 formed over the intrinsic type amorphous silicon layer 1024. In certain embodiments, the p-type amorphous silicon layer 1022 may be formed to a thickness between about 60 Angstroms (Å) and about 200 Å. In certain embodiments, the intrinsic type amorphous silicon layer 1024 may be formed to a thickness between about 1,500 Å and about 5,000 Å. In certain embodiments, the n-type amorphous semiconductor layer 1026 may be formed to a thickness between about 100 Å and about 400 Å. In certain embodiments, as shown in FIG. 10, the p-i-n junction 1020 may also comprise a degenerately (e.g. heavily) doped $n^{++}$-type amorphous semiconductor layer 1027 that may be formed to a thickness between about 50 Å and about 150 Å.

The metal back layer 1034 may include, but not limited to a material selected from the group consisting of Al, Ag, Ti, Cr, Au, Cu, Pt, alloys thereof, or combinations thereof. Other processes may be performed to form the Solar cell 1000, such laser scribing processes. Other films, materials, substrates, and/or packaging may be provided over metal back layer 150 to complete the solar cell.

Referring to FIG. 4, although a single chamber is illustrated, a system 500, such as illustrated in FIG. 5, may contain a plurality of chambers arranged around a substrate maneuvering robot 522. In such a system, one or more amorphous silicon layers may be deposited in one chamber before the substrate is moved to another chamber where additional layers are deposited. Typically, the p-type layers are deposited on the substrate in a first chamber and then the substrate is moved to another chamber where an i-type layer and an n-type layer are deposited on the substrate.

In one embodiment, the heating and/or cooling elements 439 may be set to provide a substrate support temperature during deposition of about 250 degrees Celsius or less. In one embodiment, the substrate support is maintained at a temperature between about 150 degrees Celsius and about 250 degrees Celsius. In one example, the substrate support is maintained at a temperature of about 200 degrees Celsius. The spacing during various deposition steps between the top surface of a substrate 102 that is disposed on the substrate receiving surface 432 of the substrate support 430, and the showerhead 410 (i.e., RF electrode) may be between 600 mil and about 6,000 mil. Typical thicknesses of glass substrates for solar applications are between about 40 mil and 200 mil.

In one embodiment, a p-i-n amorphous silicon solar cell is formed using the following the steps described below. The process values and examples discussed below are not intended to be limiting as to the scope of the invention described herein, and in some cases relate to a 60 k processing system that has a chamber volume of about 2900 liters and is adapted to process a 2200 mm×2600 mm substrate. First, a substrate having a TCO layer 110 disposed on at least one surface is inserted into the PECVD chamber 400 and placed upon the substrate support 430 so that the TCO 110 can receive one or more of the layers contained in the p-i-n junction 1020.

In one embodiment, prior to depositing one or more of the layers in the p-i-n junction 1020, the temperature of the substrate is stabilized by flowing a gas, such as argon, hydrogen or helium, through the processing chamber for a period between about 3 to about 5 minutes to permit the temperature of a typical 3 mm to 5 mm thick glass substrate to be raised to a desired temperature, such as about 20° C. In one example, temperature stabilization step comprises providing an argon gas at a flow rate of about 25.8 sccm/L (e.g., 75,000 sccm) to achieve a chamber pressure between about 2.0 and about 2.5 Torr to stabilize the temperature of a substrate that is positioned about 640 mils from the showerhead 410 at a desirable level within about 5 minutes. In this case the substrate support can be maintained at a temperature of about 200° C.

In the next step, or plasma cleaning step, a plasma is generated in the processing volume 406 while the argon, hydrogen or helium gas is delivered through the chamber to clean the surface of the TCO layer 110 and to improve the electrical properties of the TCO layer 110. In one embodiment, the gas flowing through the processing volume comprises argon, since hydrogen containing plasmas may aggressively react with the TCO layer, such as TCO layers containing tin oxide. In one embodiment, it is desirable to perform the plasma cleaning step using a cleaning gas that comprises hydrogen gas on a TCO layer that comprises zinc oxide.

In the next step, generally after cleaning the surface of the TCO layer 110, a p-type doped amorphous layer is deposited on the TCO surface. In one embodiment, the p-type doped amorphous layer is deposited in two phases, the first phase process may utilize a hydrogen to silane dilution ratio of between about 0 and about 6.0. This low hydrogen dilution ratio is utilized to prevent damage to the TCO layer, which could occur due to the interaction of the TCO layer and the generated plasma. In one embodiment, the first p-type doped amorphous layer is a degenerately (e.g., heavily) doped $p^{++}$-type amorphous silicon layer that has a doping concentration equivalent to a layer formed using a TMB:silane precursor gas mixture ratio of between about 2:1 and about 6:1 at a pressure of between about 2 and about 2.5 Torr, where the TMB precursor comprises 0.5% TMB. In one embodiment, the first p-type doped amorphous layer is formed at a plasma power between about 45 milliwatts/$cm^2$ (2400 Watts) and about 91 milliwatts/$cm^2$ (4800 Watts). In one example, the first phase of the p-type amorphous silicon layer, such as part of the layer 1022 illustrated in FIG. 10, may be formed by providing silane at a flow rate of between about 2.1 sccm/L (e.g., 6000 sccm) about 3.1 sccm/L (e.g., 9000 sccm), hydrogen gas at a flow rate so that the hydrogen gas to silane gas mixture ratio is about 6.0, a doping precursor at a flow rate equivalent to a 0.5% TMB gas to silane gas mixture ratio of 6:1, while the substrate support temperature is maintained at about 200° C., the plasma power is controlled between about 57 milliwatts/cm$^2$ (3287 Watts) and the chamber pressure is maintained at about 2.5 Torr for about 2-10 seconds to form about a 10-50 Å film. In this example, the substrate can be positioned about 640 mils from the showerhead 410. It is believed that amorphous p-type doped silicon layers formed at this doping concentration will improve the hole transport of the silicon solar cell.

After deposition of the first p-type doped amorphous layer, a second p-type doped amorphous layer can then deposited. The second p-type doped amorphous layer, which may have a thickness between about 80 and 150 Å, is generally deposited using a doping concentration that is equivalent to a layer formed using a TMB:silane precursor mixture ratio of between about 1:1 and about 2:3, and a hydrogen silane dilution ratio of between about 5 and about 10. In one embodiment, the second p-type doped amorphous layer is formed at a plasma power between about 45 milliwatts/cm$^2$ (2400 Watts) and about 91 milliwatts/cm$^2$ (4800 Watts). Also, in one embodiment, it is desirable to provide an amount of a carbon to the deposited film by delivering a carbon containing precursor gas, such as methane ($CH_4$), into the processing region during the second amorphous silicon p-type doped layer deposition process to increase the conductivity of the deposited film. In one embodiment, the pure methane to silane ratio is varied between about 1:1 to about 2:3 (methane:silane), where the silane flow rate may vary between about 2.1 sccm/L (6000 sccm), and about 3.1 sccm/L (9000 sccm). In one example, the second phase of the p-type amorphous silicon layer may be formed by providing silane at a flow rate of between about 2.3 sccm/L (6702 sccm), hydrogen gas at a flow rate so that the hydrogen gas to silane gas mixture ratio is about 10.0, a doping precursor at a flow rate equivalent to a 0.5% TMB gas to silane gas mixture ratio of 5.8:1, methane gas at a flow rate so that the methane gas to silane gas mixture ratio is about 1:1, while the substrate support temperature is maintained at about 200° C., the plasma power is controlled to about 56 milliwatts/cm$^2$ (3217 Watts) and the chamber pressure is maintained at about 2.5 Torr to form a 120 Å in about 21 seconds. In this example, the substrate can be positioned about 640 mils from the showerhead 410. Use of a second p-type doped amorphous layer immediately following the first p-type doped amorphous layer is believed to help reduce the optical absorption loses due to the use of a thin heavily (e.g., degenerately) doped first p-type layer and the use of the thicker wider band gap second p-type amorphous layer material.

During one or more of the PECVD deposition steps, such as during the p-type layer deposition steps, a static charge can build up on the substrate. The static charge may become sufficiently large so that it can cause damage to the substrate as it is forcibly removed from the substrate receiving surface 432 by a mechanical substrate lift mechanism. To eliminate the static charge, a hydrogen plasma is created within the chamber while the spacing between the upper surface of the substrate and the showerhead may be varied. Therefore, in one embodiment, since some of the deposition steps used to form a solar cell device are performed in a different chamber (e.g., p-type deposition step, i-type deposition step, n-type deposition step) an optional plasma processing step, or power lift step, is used to help separate the substrate 102 from the substrate support 430 prior to transferring the substrate from the processing chamber. The generated plasma allows the charge collected in the dielectric substrate, during the previous processing steps, to be discharged. In this step, a plasma is generated in the processing volume 406 while an argon, hydrogen or helium gas passes through the processing chamber to form a path for the trapped charge in the substrate to be dissipated. The substrate support may also be maintained at a desired temperature, such as about 200° C. In one embodiment, the power lift step comprises multiple steps at various substrate to showerhead spacings, such as 6 steps at various spacings, to completely eliminate the static charge. In one embodiment, a primarily hydrogen containing gas is delivered through the processing volume at a flow rate between about 5.2 sccm/L (15,000 sccm) and about 15.5 sccm/L (45000 sccm) at an RF power between about 38 milliwatts/cm$^2$ (1000 Watts) and about 76 milliwatts/cm$^2$ (4000 Watts). In one example, power lift step comprises providing a hydrogen gas at a flow rate between about 10.3 sccm/L (30,000 sccm) to achieve a chamber pressure of about 2.0 Torr while the substrate is positioned about 1400 mils from the showerhead 410 and an RF power of about 57 milliwatts/cm$^2$ is delivered for about 3 seconds. In another example, a power lift step comprises a first step in which a hydrogen gas at a flow rate between about 10.3 sccm/L (30,000 sccm) is delivered to achieve a chamber pressure of about 2.0 Torr while the substrate is positioned about 1400 mils from the showerhead 410 an RF power of about 57 milliwatts/cm$^2$ is delivered for about 3 seconds, and a second step in which a hydrogen gas at a flow rate between about 10.3 sccm/L (30,000 sccm) is delivered to achieve a chamber pressure of about 2.0 Torr while the substrate is positioned about 6000 mils from the showerhead 410 an RF power of about 57 milliwatts/cm$^2$ is delivered for about 5 seconds.

In the next step, optionally a hydrogen gas may be delivered through the processing chamber for a period of approximately 20 seconds to allow the substrate to stabilize at the desired temperature, such as about 20° C. In some cases, the time period used to complete this step may be short, since it is believed that a substrate that has a p-type material deposited thereon will not lose a substantial amount of its temperature when it is transported in a vacuum environment from one chamber to another within a multi-chamber PECVD system. In one example, temperature stabilization step comprises providing an argon gas at a flow rate between about 25.9 sccm/L (75,000 sccm) to achieve a chamber pressure of about 2.5 Torr to stabilize the temperature of a substrate that is positioned about 640 mils from the showerhead 410 after about 20-60 seconds. The substrate support can be maintained at a temperature of about 200° C.

In the next step, or plasma clean step, which is typically performed on the substrate once the substrate has been loaded into a second processing chamber. In this step, a hydrogen plasma is generated in the processing volume of the second processing chamber to properly clean the surface of the deposited p-type layer before the deposition of the next material layer, such as a barrier layer. The hydrogen plasma treatment can passivate the p-type layer, remove any surface defects which may have been formed thereon, and also suppresses any carbon and boron contamination which may tend to diffuse into the i-type layer without the hydrogen plasma treatment step. In one embodiment, the hydrogen plasma clean step comprises providing plasma power between about 35 milliWatts/cm$^2$ (2000 Watts) and about 136 milliWatts/cm$^2$ (7200 Watts) and enough hydrogen gas to achieve a chamber pressure of between about 2 and about 2.5 Torr for between about 0 and about 60 seconds. In one example, hydrogen plasma clean step comprises providing a hydrogen gas at a flow rate between about 10.3 sccm/L (30,000 sccm) and plasma power of 52 milliWatts/cm$^2$ (3000 Watts) to achieve a chamber pressure of about 2.5 Torr while the substrate is positioned about 640 mils from the showerhead 410 for about 15 seconds.

It has been found that a barrier layer 1023 at the interface between the p-i layers can improve the electrical performance of the solar cell. In one embodiment, the barrier layer 1023 is similar to the PIB layer discussed above. In certain embodiments, the barrier layer 1023 is formed by plasma deposition using a silane precursor that is diluted in hydrogen at a ratio of between about 20 and about 50 at a pressure equal to or about 0.5 Torr greater than the subsequent i-layer deposition process for about 38 and about 225 seconds to form a barrier layer having a thickness between about 50 and 300 Å. It is believed that the barrier layer provides a wide band gap that will improve the open circuit voltage of the solar cell by up to about 50 meV. The barrier layer may be used to minimize the ion bombardment of the prior deposited layers, since it is placed between the prior deposited layer(s) and the subsequently deposited high deposition rate intrinsic layer discussed below. To minimize the bombardment of the prior deposited layers during the barrier layer deposition step, the deposition process typically uses a low RF plasma deposition power. In one embodiment, the barrier layer is an intrinsic amorphous material that is formed on the substrate using a hydrogen-diluted silane gas mixture having a dilution ratio between about 20 and about 50, chamber pressure equal to or greater than the i-layer deposition process, and an RF plasma power between about 23 milliWatts/cm$^2$ (1200 Watts) and about 61 milliWatts/cm$^2$ (3240 Watts) in a period of time between about 18 and about 3600 seconds. In one configuration the chamber pressure is equal to or about 0.5 Torr greater than the i-layer deposition process. In one example, the barrier layer comprising an intrinsic amorphous silicon layer is formed by providing silane at a flow rate of about 1.5 sccm/L (4235 sccm), hydrogen gas at a flow rate so that the hydrogen gas to silane gas mixture ratio is about 25, while the substrate support temperature is maintained at about 200° C., the plasma power is controlled to about 27 milliWatts/cm$^2$ (1525 Watts) and the chamber pressure is maintained at about 3.0 Torr for about 35 seconds. In one configuration, due to the properties of the barrier layer film formed using the processes discussed herein, it is believed that the barrier layer can be used to help improve the blue light absorption in the formed solar cell device, and thus the solar cell's efficiency. The deposition of a barrier layer at a hydrogen to silane dilution ratio of between about 20 and about 50 and a flow rate of more than 37.9 sccm/L (110,000 sccm) is believed to improve the electrical characteristics, such as fill factor and better light stability, than other conventionally formed solar cell devices.

In the next step, an intrinsic layer 1024 is deposited on the substrate surface. Subsequent to the deposition of the buffer layer, a 2000 to 3000 Å thick layer of an intrinsic amorphous material is formed on the substrate using a hydrogen-diluted silane gas mixture having a dilution ratio between about 8 and about 15, chamber pressure between about 2 and about 3 Torr, and an RF plasma power between about 27 milliWatts/cm$^2$ (1440 Watts) and about 91 milliWatts/cm$^2$ in a period of time between about 300 and about 1800 seconds. In one example, a 2600 Å intrinsic amorphous layer may be formed by providing silane at a flow rate of about 9000 sccm, hydrogen gas at a flow rate so that the hydrogen gas to silane gas mixture ratio is about 12.5, while the substrate support temperature is maintained at about 200° C., the plasma power is controlled to about 55 milliwatts/cm$^2$ (3168 Watts), and the chamber pressure is maintained at about 2.5 Torr for about 736 seconds.

In the next step, an n-type doped amorphous layer 1026 is deposited on the i-type intrinsic layer 1024 surface utilizing a hydrogen to silane dilution ratio of between about 5.0 and about 9.0, a doping precursor at a flow rate equivalent to a 0.5% phosphine (PH$_3$) gas to silane gas mixture ratio of between about 1:1 and about 1:3 dopant:silane ratio, an RF plasma power between about 68 (3600 Watts) and about 114 milliWatts/cm$^2$ (6000 Watts) and a chamber pressure of between about 1 and about 3 Torr in a period of time between about 24 and about 36 seconds. In one example, a 200-300 Å n-type amorphous silicon layer is formed by providing silane at a flow rate of about 1.0 sccm/L (3000 sccm) and about 3.1 sccm/L (6000 sccm), hydrogen gas at a flow rate so that the hydrogen gas to silane gas mixture ratio is about 5.0, a doping precursor at a flow rate equivalent to a 0.5% phosphine (PH$_3$) gas to silane gas mixture ratio of 1:3, while the substrate support temperature is maintained at about 200° C., the plasma power is controlled to about 81 milliwatts/cm$^2$ (4678 Watts) and the chamber pressure is maintained at about 1.5 Torr for about 25 seconds. In this example, the substrate can be positioned about 640 mils from the showerhead 410.

In the next step, a degenerately doped (e.g., n$^{++}$) n-type doped amorphous layer 1027 is deposited on the n-type layer 1026 surface utilizing a hydrogen to silane dilution ratio of between about 5.0 and about 9.0, a doping precursor at a flow rate equivalent to a 0.5% phosphine (PH$_3$) gas to silane mixture ratio of between about 1:2 and about 1:5 (phosphine:silane ratio), an RF plasma power between about 68 milliWatts/cm$^2$ (3600 Watts) and about 113 milliWatts/cm$^2$ (6000 Watts) and a chamber pressure of between about 1 and about 3 Torr for between about 8 and about 25 seconds to form a 50 to 150 Å thick layer. In one example, a 80 Å n$^{++}$-type amorphous silicon layer is formed by providing silane at a flow rate between about 0.5 sccm/L (1500 sccm) and about 3.1 sccm/L (6000 sccm), hydrogen gas at a flow rate so that the hydrogen gas to silane gas mixture ratio is about 8.3, a doping precursor at a flow rate equivalent to a phosphine (PH$_3$) gas to silane gas mixture ratio of 5:1, while the substrate support temperature is maintained at about 200° C., the plasma power is controlled to about 72 milliwatts/cm$^2$ (4153 Watts) and the chamber pressure is maintained at about 1.5 Torr for about 10 seconds. In this example, the substrate can be positioned about 640 mils from the showerhead 410.

After the n and n+ layers are formed, then a plasma may again generated in the processing volume in order to eliminate the static charge on the substrate, as discussed above. In one embodiment, this step comprises multiple sub-steps at various substrate to showerhead spacings, such as 6 steps at various spacings, to completely eliminate the static charge. In one embodiment, the gas flowing through the processing volume comprises hydrogen. In one example, the so called "power lift step" comprises providing a hydrogen gas at a flow rate of about 10.3 sccm/L (30,000 sccm) to achieve a chamber pressure of about 2.0 Torr while the substrate is positioned about 1400 mils from the showerhead 410 and an RF power of about 57 milliwatts/cm$^2$ is delivered for about 3 seconds. In another example, a power lift step comprises a first step in which a hydrogen gas at a flow rate between about 10.3 sccm/L (30,000 sccm) to achieve a chamber pressure of about 2.0 Torr while the substrate is positioned about 1400 mils from the showerhead 410 and an RF power of about 57 milliwatts/cm$^2$ is delivered for about 3 seconds, and a second step in which a hydrogen gas at a flow rate between about 10.3 sccm/L (30,000 sccm) to achieve a chamber pressure of about 2.0 Torr while the substrate is positioned about 6000 mils from the showerhead 410 and an RF power of about 57 milliwatts/cm$^2$ is delivered for about 5 seconds.

While the foregoing is directed to embodiments of the present invention, other and further embodiments of the invention may be devised without departing from the basic scope thereof, and the scope thereof is determined by the claims that follow. For example, the process chamber of FIG. 4 has been shown in a horizontal position. It is understood that in other embodiments of the invention the process chamber may be in any non-horizontal position, such as vertical. For example, embodiments of the invention have been described in reference to the multi-process chamber cluster tool in FIG. 5. It is understood that embodiments of the invention may also be practiced in on in-line systems and hybrid in-line/cluster systems. For example, embodiments of the invention have been described in reference to a first system configured to form a first p-i-n junction and a second p-i-n junction. It is understood that in other embodiments of the invention, the first p-i-n junction and a second p-i-n junction may be formed in a single system. For example, embodiments of the invention have been described in reference to a process chamber adapted to deposit both an intrinsic type layer and an n-type layer. It is understood that in other embodiments of the invention, separate chambers may be adapted to deposit the intrinsic type layer and the n-type layer. It is understood that in other embodiments of the invention, a process chamber may be adapted to deposit both a p-type layer and an intrinsic type layer.

The invention claimed is:

1. A tandem junction photovoltaic device, comprising:
a first photovoltaic junction and a second photovoltaic junction, wherein the first photovoltaic junction comprises:
a p-type amorphous silicon layer;
a p-i buffer intrinsic type amorphous silicon layer;
a bulk intrinsic type amorphous silicon layer, wherein the p-i buffer intrinsic type amorphous silicon layer and the bulk intrinsic type amorphous silicon layer are deposited in a single processing chamber by supplying a gas mixture including a silicon containing gas and a hydrogen containing gas, wherein the hydrogen containing gas supplied into the processing chamber is gradually reduced to smoothly transition depositing the p-i buffer intrinsic type amorphous silicon layer to depositing the bulk intrinsic type amorphous silicon layer; and
a n-type microcrystalline silicon layer; and wherein the second photovoltaic junction comprises:
a p-doped microcrystalline silicon layer;
an intrinsic type microcrystalline silicon layer; and
a n-doped amorphous silicon layer adjacent to the intrinsic type microcrystalline silicon layer.

2. The device of claim 1, further comprising:
an interfacial layer disposed between the first and the second photovoltaic junction.

3. The device of claim 1, wherein the intrinsic type microcrystalline silicon layer is formed by a multiple step deposition process, wherein each deposition step has different hydrogen to silane gas ratio.

4. The device of claim 1, wherein the p-i buffer intrinsic type amorphous silicon layer and the bulk intrinsic type amorphous silicon layer are deposited in a single processing chamber by varying a hydrogen to silane gas ratio.

5. The device of claim 3, wherein the hydrogen to silane gas ratio is decreased in each successive deposition step used to deposit the intrinsic type microcrystalline silicon layer.

6. The device of claim 1, wherein n-doped amorphous silicon layer further comprises:
a first n-doped layer disposed over the intrinsic type microcrystalline silicon layer; and
a second n-doped amorphous layer disposed on the first n-doped layer, wherein the doping level in the second n-doped amorphous layer is greater than the doping level in the first n-doped layer.

7. The device of claim 1, further comprising:
an interfacial layer disposed between the first photovoltaic junction and the second photovoltaic junction, wherein the interfacial layer comprises a material selected from a group consisting of silicon oxynitride, silicon nitride, silicon carbide, silicon oxide, SiOC, and SiCN.

8. The device of claim 1, further comprising:
a lower interfacial layer disposed over the second photovoltaic junction in contact with the n-doped amorphous silicon layer, wherein the n-doped amorphous silicon layer is disposed adjacent to the intrinsic type microcrystalline silicon layer.

9. The device of claim 8, wherein the lower interfacial layer comprises at least one of heavily doped n-type amorphous silicon layer, n-type microcrystalline silicon layer, a n-type amorphous silicon layer, silicon oxynitride, silicon nitride, silicon carbide, silicon oxide, SiOC, or SiCN.

10. The device of claim 1, further comprising:
a first transparent conductive oxide layer disposed over a surface of a substrate; and
a p-type microcrystalline silicon contact layer disposed between the p-type amorphous silicon layer and the first transparent conductive oxide layer.

11. The device of claim 10, wherein:
the first transparent conductive oxide layer comprises zinc and oxygen, and
the p-type microcrystalline silicon contact layer has a thickness between about 20 Å and about 200 Å.

12. The device of claim 1, further comprising:
an n-type amorphous silicon buffer layer disposed between the a bulk intrinsic type amorphous silicon layer and the n-type microcrystalline silicon layer, wherein the n-type amorphous silicon buffer layer is between about 10 Å and about 200 Å thick and comprises silicon that has a phosphorous dopant concentration between about $1 \times 10^{18}$ atoms/cm$^2$ and about $1 \times 10^{20}$ atoms/cm$^2$.

13. The device of claim 1, wherein the p-i buffer intrinsic type amorphous silicon layer is formed by a process comprising:
delivering a silane gas at a second flow rate to the processing volume;
delivering a hydrogen containing gas to the processing volume so that the ratio of the flow rate of the hydrogen containing gas to second flow rate is between about 20 and about 50; and
controlling the pressure in the processing volume to pressure greater than or equal to the first pressure.

14. The device of claim 13, wherein the bulk intrinsic type amorphous silicon layer is formed by a process comprising:
delivering a silane gas at a first flow rate to a processing volume that is adjacent to a surface of the substrate;
delivering a hydrogen containing gas to the processing volume so that the hydrogen to silane dilution ratio is between about 8 and about 15; and
controlling the pressure in the processing volume to a first pressure.

15. The device of claim 1, wherein the p-i buffer intrinsic type amorphous silicon layer has a thickness of less than about 200 Å.

16. The device of claim 1, wherein the p-i buffer intrinsic type amorphous silicon layer is formed by a process comprising:

delivering the hydrogen containing gas at a hydrogen to silane containing gas ratio that is decreased during the process of forming the p-i buffer intrinsic type amorphous silicon layer.

17. The device of claim 1, wherein the p-i buffer intrinsic type amorphous silicon layer is formed by delivering a silane containing gas at a hydrogen containing gas at a hydrogen to silane gas ratio of between about 40:1 and about 20:1, and the bulk intrinsic type amorphous silicon layer is formed by delivering a silane containing gas and a hydrogen containing gas at a hydrogen to silane gas ratio of less than about 20:1.

\* \* \* \* \*